United States Patent
Dixon et al.

(10) Patent No.: US 7,515,498 B2
(45) Date of Patent: Apr. 7, 2009

(54) ELECTRONIC FUSE APPARATUS AND METHODOLOGY INCLUDING ADDRESSABLE VIRTUAL ELECTRONIC FUSES

(75) Inventors: Robert Christopher Dixon, Austin, TX (US); Michael Wayne Harper, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 11/674,227

(22) Filed: Feb. 13, 2007

(65) Prior Publication Data

US 2008/0191780 A1    Aug. 14, 2008

(51) Int. Cl.
G11C 7/00    (2006.01)
(52) U.S. Cl. ........................... 365/225.7; 365/96
(58) Field of Classification Search ............. 365/225.7, 365/96; 327/52
See application file for complete search history.

(56) References Cited

U.S. PATENT DOCUMENTS

| | | | |
|---|---|---|---|
| 5,966,339 A | 10/1999 | Hsu | |
| 6,141,245 A | 10/2000 | Bertin | |
| 6,219,215 B1 | 4/2001 | Bertin | |
| 6,243,283 B1 | 6/2001 | Bertin | |
| 6,346,846 B1 | 2/2002 | Bertin | |
| 6,384,666 B1 | 5/2002 | Bertin | |
| 6,400,632 B1 * | 6/2002 | Tanizaki et al. | 365/225.7 |
| 6,545,926 B2 * | 4/2003 | Ooishi et al. | 365/225.7 |
| 6,552,549 B1 | 4/2003 | Kaiser | |
| 6,633,055 B2 | 10/2003 | Bertin | |
| 6,913,954 B2 | 7/2005 | Kothandaraman | |
| 6,933,591 B1 | 8/2005 | Sidhu | |
| 7,064,946 B2 | 6/2006 | Thiery et al. | |
| 7,089,136 B2 | 8/2006 | Anand et al. | |
| 7,098,721 B2 | 8/2006 | Ouellette et al. | |
| 2006/0181330 A1 | 8/2006 | Dixon | |
| 2006/0249808 A1 | 11/2006 | Hsu | |

FOREIGN PATENT DOCUMENTS

EP    0528744 A1    2/1993

OTHER PUBLICATIONS

CPU Shack—EPROM—(© 2005).
IBM-IBM Introduces Chip Morphing Technology, IBM Corp. (Jul. 30, 2004).
Microchip—AN536 Basic Serial EEPROM Operation, Microchip Technology Inc. (© 1993).

* cited by examiner

*Primary Examiner*—Son Dinh
(74) *Attorney, Agent, or Firm*—Diana Gerhardt; Mark P Kahler

(57) ABSTRACT

A virtual electronic fuse (VEF) apparatus and methodology are disclosed that permit the state of an electronic fuse to change from an un-blown state to a blown state and then back to a virtual un-blown state. In one embodiment, the electronic fuse may change from the virtual un-blown state back again to a virtual blown state. The fuse apparatus includes multiple VEFs, each VEF exhibiting a respective address. The fuse apparatus also includes an address pool including multiple address pool locations. A fuse programmer stores an address of one of the VEFs in one or more address pool locations to indicate one or more state changes for a particular VEF. The fuse programmer may also store different VEF addresses in different address pool locations to indicate state changes for different VEFs.

29 Claims, 13 Drawing Sheets

ELECTRONIC FUSE APPARATUS AND METHODOLOGY INCLUDING ADDRESSABLE VIRTUAL ELECTRONIC FUSES

CROSS REFERENCE TO RELATED PATENT APPLICATIONS

This patent application relates to the U.S. patent application entitled "Virtual Electronic Fuse Apparatus and Methodology", inventors Dixon, et al., application Ser. No. 11/674,238, the disclosure of which is incorporated herein by reference in its entirety.

TECHNICAL FIELD OF THE INVENTION

The disclosures herein relate generally to electronic fuses, and more particularly, to an apparatus and methodology for programming electronic fuses in electronic devices.

BACKGROUND

Modern electronic devices often include electronic fuses for use in final configuration after completion of semiconductor masking and fabrication processes. These electronic fuses are typically useful in the customization of electronic devices or to correct semiconductor manufacturing defects. For example, an integrated circuit such as a processor may include multiple electronic fuses that store digital information. Each electronic fuse may store a logic 0 or logic 1 depending on whether the fuse exhibits an un-blown state or a blown-state. A programming mechanism passes a high current through a polysilicon electronic fuse to permanently change the resistance of the fuse from a low resistance of approximately 100 ohms (the un-blown state) to a high resistance of approximately 5K ohms (the blown state). This action effectively "blows the fuse".

A "blown fuse" is an electronic fuse that exhibits high resistance after the programming mechanism passes a high current therethrough. An "un-blown fuse" is an electronic fuse that still exhibits a low resistance. The programming mechanism stores digital information in an electronic fuse bank by either blowing or not blowing individual fuses of the bank. An un-blown fuse that exhibits a low resistance may correspond to a logic low or 0. A blown fuse that exhibits a high resistance may correspond to a logic high or 1. This logic convention is reversible.

Once the programming mechanism stores digital information in the electronic fuse bank of an electronic device, the storage is permanent or nonvolatile. Nonvolatile storage of digital information is often desirable. However, circumstances arise wherein it is desirable to change or update the digital information in a nonvolatile electronic fuse bank. For example, a processor manufacturer may store final configuration information in the fuse bank of the processor. It is possible that after manufacturing a large quantity of processors and programming the fuse banks with final configuration information, an unexpected engineering change may require that the processors include different final configuration information. Under these circumstances, with no mechanism to update the final configuration information, it is unfortunately possible that those processors that store the original final configuration information may become scrap. Clearly, designating a large quantity of expensive electronic devices as scrap is not desirable.

SUMMARY

What is needed is a method and an apparatus that address the problems above.

Accordingly, in one embodiment, a method is disclosed for changing state in an electronic fuse system. The method includes providing a plurality of virtual electronic fuses (VEFs) that may each exhibit a virtual blown state or a virtual un-blown state, each VEF having a respective address. The method also includes transmitting, by a fuse programmer, the address of a particular VEF to designate the particular VEF for state change. The method further includes changing the state of the particular VEF from one of the virtual blown state and the virtual un-blown state to the other of the virtual blown state and the virtual un-blown state.

In another embodiment, an electronic fuse system is disclosed that includes a plurality of virtual electronic fuses (VEFs) that may each exhibit a virtual blown state or a virtual un-blown state, each VEF having a respective address. Each VEF includes a real electronic fuse (REF) that may exhibit a real un-blown state or a real blown state. Each VEF includes a detector, coupled to the REF, that indicates one of the virtual blown state and the virtual un-blown state if the detector receives an odd number of input signals exhibiting a first logic state. The detector indicates the other of the virtual blown state and the virtual un-blown state if the detector receives an even number of logic signals exhibiting the first logic state.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Figure 1:
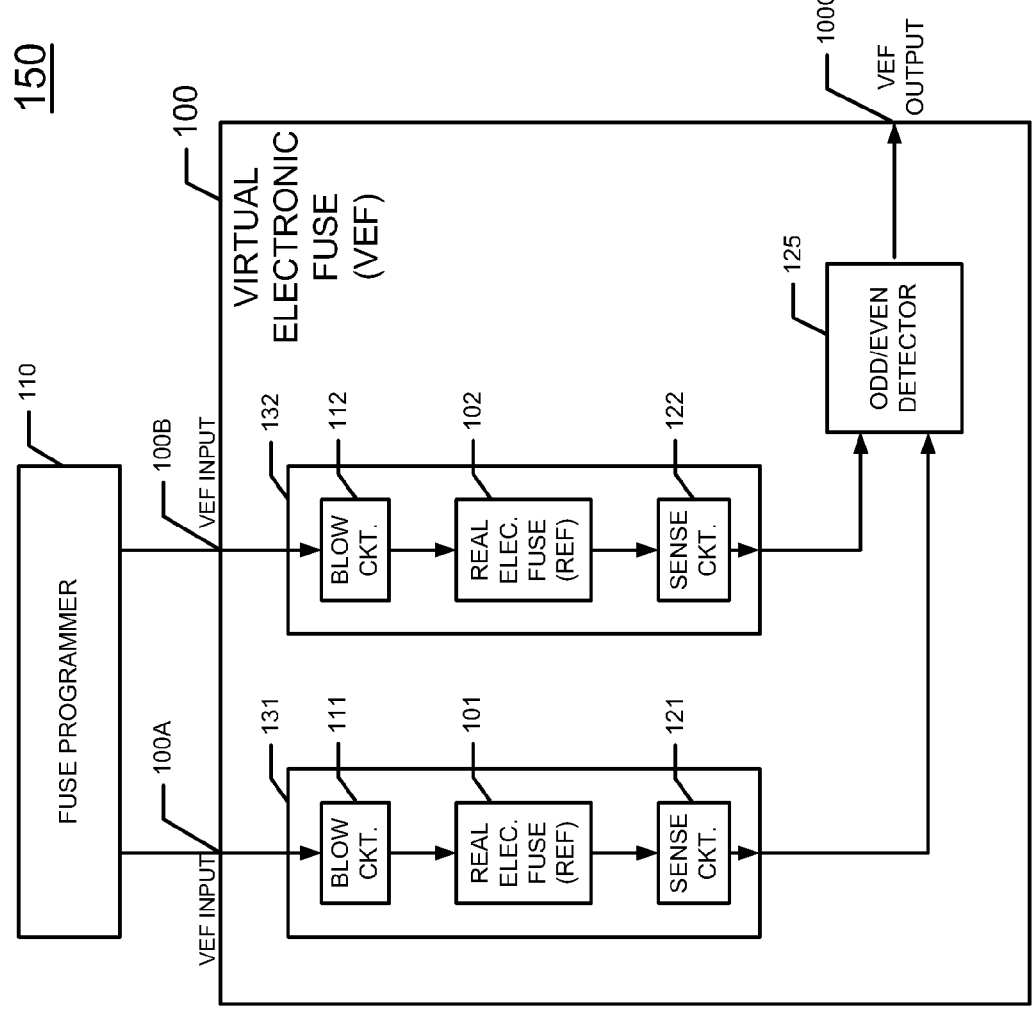
FIG. 1 shows a block diagram of one embodiment of the disclosed virtual electronic fuse.

FIG. 1 shows a block diagram of a virtual electronic fuse (VEF) 100 that includes multiple real electronic fuses (REFs), for example real electronic fuses 101 and 102 in one embodiment. A real electronic fuse (REF) is a physical electronic fuse device that exhibits either an un-blown or blown state. In the un-blown state, the REF exhibits a low impedance, while in the blown-state the REF exhibits a high impedance. One real electronic fuse is the "eFUSE" electronic fuse from IBM Corporation. (eFUSE is a trademark of the IBM Corporation.) The disclosed virtual electronic fuse 100 may include several real electronic fuses such as representative real electronic fuses 101 and 102 in FIG. 1. In one embodiment, the disclosed virtual electronic fuse (VEF) may change state from a "virtual un-blown state" to a "virtual blown state" and from a "virtual blown state" to a "virtual un-blown state" one or more times.

A fuse programmer 110 couples to inputs 100A and 100B of virtual electronic fuse (VEF) 100 as shown. A blow circuit and a sense circuit couple to each of real electronic fuses (REFs) 101 and 102, respectively. More particularly, a blow circuit 111 couples between VEF input 100A and REF 101. A sense circuit 121 couples between the output of REF 101 and one input of odd/even detector 125. Similarly, now with respect to real electronic fuse (REF) 102, a blow circuit 112 couples between fuse programmer 110 and REF 102. A sense circuit 122 couples between REF 102 and the remaining input of odd/even detector 125.

Real electronic fuse (REF) 101 cooperates with blow circuit 111 and sense circuit 121 to form fuse assembly 131. REF 102 cooperates with a blow circuit 112 and sense circuit 122 to form fuse assembly 132. When fuse programmer 110 blows real electronic fuse (REF) 101 by sending a command signal so instructing blow circuit 111, virtual electronic fuse (VEF) 100 then exhibits an "effective blown state" or "virtual blown state". The terms "effective blown state" and "virtual blown state" are interchangeable. With one REF thus blown, namely REF 101, odd/even detector 125 detects that VEF 100 currently includes an odd number of blown fuses. In response to this determination, detector 125 generates a virtual fuse output signal at VEF output 100C to indicate that VEF exhibits a "virtual blown state".

Even though virtual electronic use (VEF) 100 now exhibits a "virtual blown state", it is possible to return VEF 100 to a "virtual un-blown state". To achieve this end, programmer 110 blows real electronic fuse (REF) 102 by sending a command signal instructing blow circuit 112 to blow REF 102. Thus, two REFs now exhibit the blown state, namely REF 101 and REF 102. In response, detector 125 detects that an even number of electronic fuses currently exhibit the blown state within virtual electronic fuse (VEF) 100. In this event, detector 125 generates a virtual fuse output signal at VEF output 100C to indicate that VEF 100 now exhibits a "virtual un-blown state". In this manner, virtual electronic fuse (VEF) 100 effectively returns to the un-blown state. While in this example VEF 100's two real electronic fuses (REFs) allow the effective or virtual return of the fuse to the un-blown state one time, other embodiments of the VEF may includes a larger number of REFs to allow the return of the fuse from the blown state to the un-blown state multiple times. In other words, the VEF may change state from the virtual un-blown state, to the virtual blown state, back to the virtual un-blown state, then back to the virtual blown state, and so forth as many times as the number of REFs in the VEF will allow.

In virtual electronic fuse (VEF) 100 of FIG. 1, blow circuit 111 is a conventional blow circuit. A blow circuit causes an electronic fuse, such as a polysilicon electronic fuse, to change state from un-blown to blown upon the application of a predetermined amount of current to the fuse. Blow circuit 112 is similar to blow circuit 111. In VEF 100, sense circuit 121 is a conventional sense circuit. A sense circuit senses the un-blown or blown state of a fuse and provides an output signal indicating that state. Sense circuit 122 is similar to sense circuit 121.

In one embodiment, odd/even detector 125 is a comparator circuit. If both of sense circuits 121 and 122 sense that electronic fuses 101 and 102 are un-blown, then sense circuits 121 and 122 provide a logic low signal to the respective inputs of odd/even detector 125. In response, detector 125 finds that the signals at its inputs are the same and generates a virtual fuse output signal at VEF output 100C that indicates that VEF 100 exhibits a "virtual un-blown state". In other words, if the number of un-blown REFs in VEF 100 is even, then the virtual fuse output signal at virtual fuse output 100C is a logic low. However, if sense circuits 121 and 122 sense that one of REFs 101 and 102 is blown and the other is un-blown, then detector 125 generates a virtual fuse output signal that indicates that the VEF 100 exhibits a "virtual blown state". In that case, the virtual fuse output signal at virtual fuse output 100C exhibits a logic high to indicate the "virtual blown state". Detector 125 thus acts as an interpreter that examines the blown or un-blown states of the real electronic fuses (REFs) 101 and 102 in VEF 100 and, in response, generates a virtual fuse output signal at 100C. to indicate the "virtual blown state" or "virtual un-blown state" of VEF 100.

To review, in the scenario above, fuse programmer 110 programmed one of REFs 101 and 102 to the blown state. Detector 125 detected the blown state of one of REFs 101 and 102. Detector 125 thus determines that an odd number of REFs exhibit the blown state. In response to detection of the odd number of blown real fuses, detector 125 changes the virtual fuse output signal at 100C to indicate that VEF 100 currently exhibits a "virtual blown state". Under some circumstances, it may be desirable to return virtual fuse 100 from the "virtual blown state" to a "virtual un-blown state". For example, an error may exist that needs correction in an electronic device that includes virtual electronic fuse 100 or the electronic device may require further customization. To return virtual electronic fuse (VEF) 100 to a "virtual un-blown state", programmer 110 programs the remaining real electronic fuse of real fuses 101 and 102 such that both real fuses exhibit the blown state. In this event, sense circuits 121 and 122 each provide a logic high signal to the respective inputs of detector 125. In response, detector 125 generates a virtual fuse output signal at output 100C that indicates that virtual electronic fuse 100 now exhibits a "virtual un-blown state". The "virtual un-blown state" of virtual electronic fuse 100 corresponds to an even number of electronic fuses such as REF 101 and 102 exhibiting the blown state. Zero is an even number. Thus, in this particular example, if neither of real electronic fuses 101 and 102 are blown (the number of blown real fuses=zero, an even number) or if both of real electronic fuses 101 and 102 are blown (the number of blown real fuses=2, an even number), then virtual electronic fuse 100 exhibits a "virtual un-blown state". Fuse programmer 110 and virtual electronic fuse 100 together form a virtual fuse apparatus 150.

Figure 2:
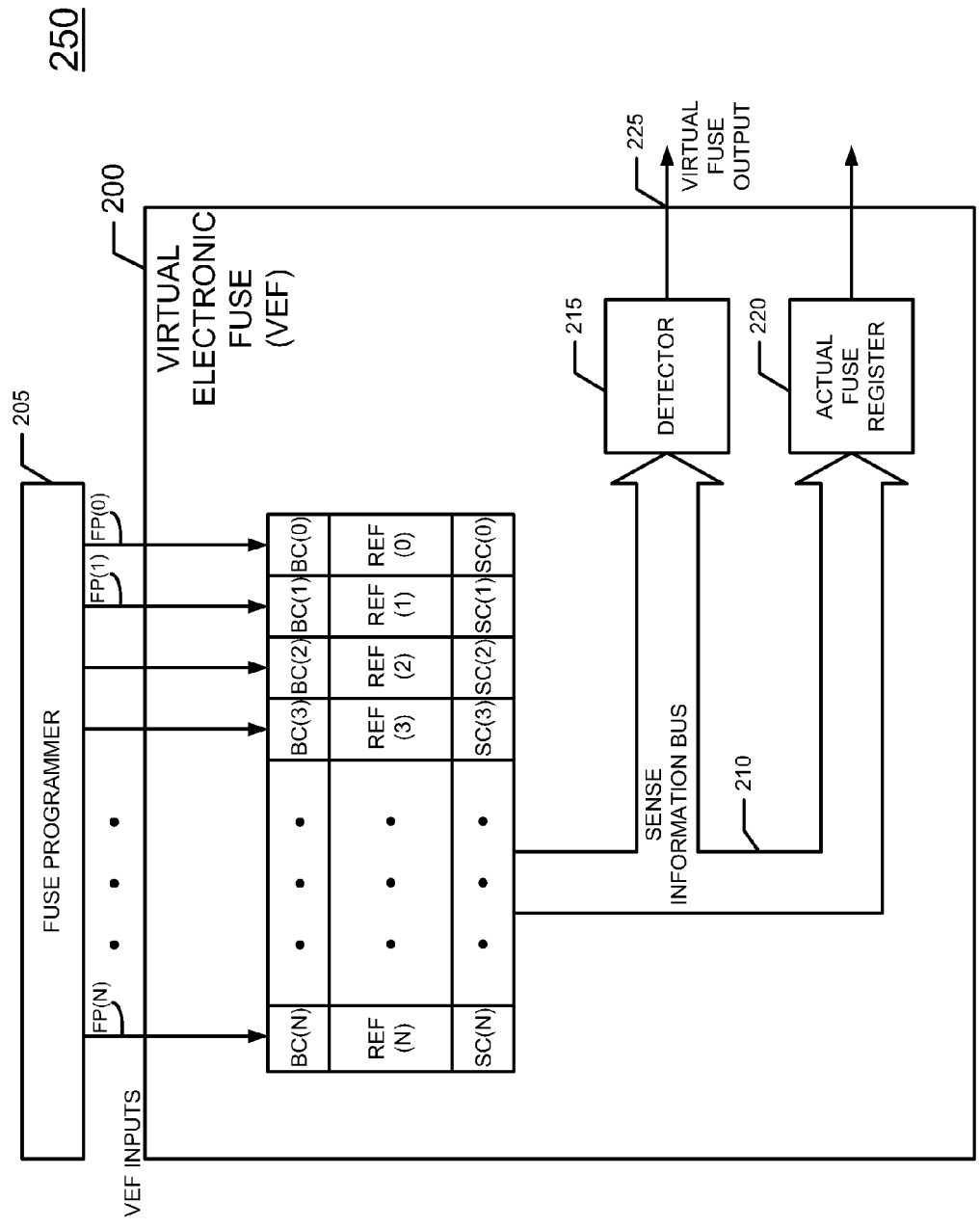
FIG. 2 is a block diagram of another embodiment of the disclosed virtual electronic fuse.

FIG. 2 is a block diagram of another embodiment of the disclosed virtual electronic fuse (VEF) 200. Whereas VEF 100 of FIG. 1 is capable of exhibiting a "virtual blown state" and returning one time to a "virtual un-blown state", VEF 200 and FIG. 2 is capable of several of these blown to un-blown state transitions and un-blown to blown transitions. Increasing the number of real electronic fuses within VEF 200 makes this improved performance possible. VEF 200 may cycle from the virtual un-blown state to the virtual blown state, back to the virtual un-blown state and then again to the virtual blown state as many times as the number of REFs in VEF 200 will permit.

Virtual electronic fuse (VEF) 200 includes real electronic fuses REF(0), REF(1), . . . REF(N) wherein N is the total number of real electronic fuses. VEF 200 also includes blow circuits BC(0), BC (1), . . . BC (N) that couple to respective inputs of real electronic fuses REF(0), REF(1), . . . REF(N), as shown in FIG. 2. VEF 200 further includes sense circuits SC(0), SC(1), . . . SC(N) that couple to respective outputs of electronic fuses REF(0), REF(1), . . . REF(N), as shown. In a manner similar to electronic fuse assembly 131 of FIG. 1, real electronic fuse REF(0) couples to blow circuit BC(0) and sense circuit SC(0) to form an electronic fuse assembly. Likewise the remaining electronic fuses REF(1) . . . REF(N) couple to respective blow circuits and sense circuits for form fuse assemblies within VEF 200.

FIG. 2 shows a fuse programmer 205 that includes a number of outputs equal to the number of real electronic fuses (REFs), namely N. More particularly, fuse programmer 205 includes outputs FP(0), FP, (1), . . . FP(N) that couple to respective blow circuits BC(0), BC (1), . . . BC (N) of VEF 200. In this manner, fuse programmer 200 may selectively instruct any of blow circuits BC(0), BC (1), . . . BC (N) to blow the respective real electronic fuse REF(0), REF(1), . . . REF (N) that couples to that blow circuit.

VEF 200 also includes a sense information bus 210 that couples each of sense circuits SC(0), SC(1), . . . SC(N) to detector 215 and actual fuse register 220. In this manner, sense information bus 210 supplies detector 215 and actual fuse register 220 with sense information that indicates the number of real electronic fuses (REFs) currently exhibiting the blown state within VEF 200.

Detector 215 interprets the sense information from sense circuits SC(0), SC(1), . . . SC(N) and generates a virtual fuse output signal at output 225 that indicates whether VEF 200 currently exhibits a "virtual blown state" or a "virtual un-blown state". In one embodiment, detector 215 is an odd/even detector. In that case, detector 215 generates a logic low output signal when detector 215 determines that an even number (0, 2, 4, . . . ) of real electronic fuses REF(0), REF(1), . . . REF(N) exhibit a real un-blown state. This logic low output signal at VEF output 225 indicates that VEF 200 exhibits the "virtual un-blown state". However, detector 215 generates a logic high output signal when detector 215 determines than an odd number (1, 3, 5, . . . ) of real electronic fuses REF(0), REF(1), . . . REF(N) exhibit the real blown state. This logic high output signal at VEF output 225 indicates that VEF 200 exhibits the "virtual blown state". The total number of transitions possible from the virtual un-blown state to the virtual blown state or the virtual blown state to the virtual un-blown state equals N wherein N>1 in this particular embodiment.

Actual fuse register 220 contains a number of bit locations equal to the number of real electronic fuses REF(0), REF(1), . . . REF(N) in VEF 200. Each bit of actual fuse register 225 corresponds to a respective real electronic fuse (REF) and indicates the state of that REF. For example, if real electronic fuse REF(0) exhibits the "blown state", then bit 0 of register 220 exhibit a logic high. If real electronic fuse REF(3) exhibits the "un-blown state", then bit 3 of register 20 exhibits a logic low. Actual fuse register 220 thus provides a path to the sensed states or values of the individual real electronic fuses (REFs) of VEF 200. This feature is useful for system software or logic (not shown) to determine the current states of individual real electronic fuses REF(0), REF(1), . . . REF(N). Fuse programmer 205 and virtual electronic fuse 200 together form a virtual fuse system 250.

Figure 3:
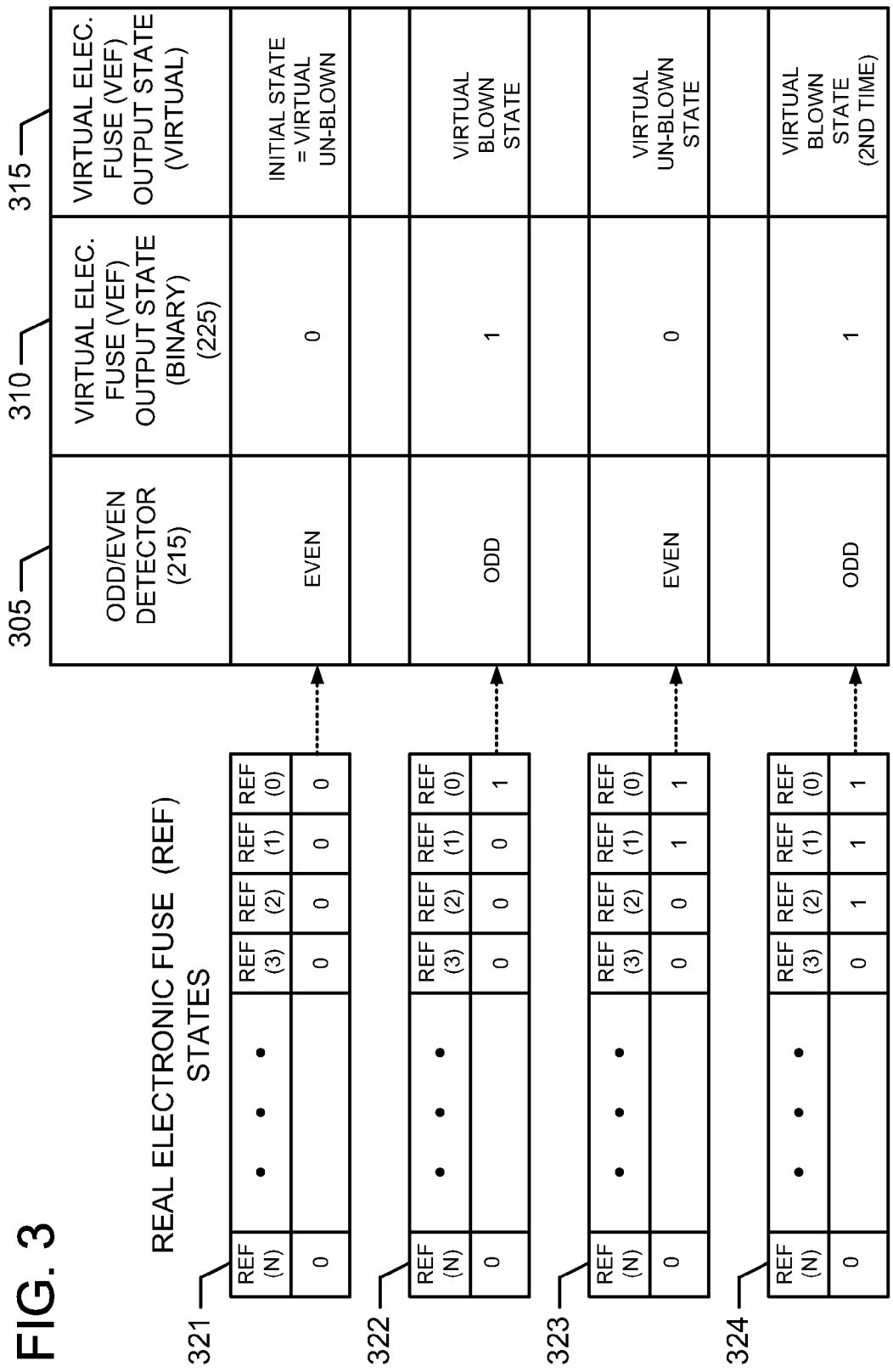
FIG. 3 is a state table that depicts the states of components in the disclosed virtual electronic fuse.

FIG. 3 is a state table that depicts the actual state of representative real electronic fuses REF(0), REF(1), . . . REF(N) while fuse programmer 205 conducts blow and un-blow operations on selected real electronic fuses (REFs) of VEF 200. FIG. 3 also shows the virtual output state of VEF 200. In more detail, FIG. 3 includes columns that depict the states of fuses REF(0), REF(1), . . . REF(N). FIG. 3 also includes column 305, 310 and 315 that depict the states of various components of VEF 200. For example, column 305 depicts the state of detector 215 as odd or even. In one embodiment, to make this determination, detector 215 counts the number of real electronic fuses (REFs) in VEF 200 that exhibit a logic high or blown state. For example, if detector 215 determines that 0, 2, 4, 6 . . . REFs exhibit a logic high, then detector 215 interprets this as "even" and generates a logic low or zero at virtual electronic fuse (VEF) output 225. Column 310 shows the binary value at virtual fuse output 225 as a logic zero in this particular "even" case. This logic zero at output 225 indicates that VEF 200 exhibits a "virtual un-blown state" as column 315 shows (initial state=virtual un-blown). However, if detector 215 determines that 1, 3, 5, . . . REFs exhibit a logic high or blown state, then detector 215 interprets this as "odd" and generates a logic high at virtual fuse output 225. This logic high at output 225 indicates that VEF 200 exhibits a "virtual blown state".

The following discusses four representative scenarios that may occur while virtual electronic fuse (VEF) 200 operates. Scenario 321 depicts the initial state of virtual electronic fuse (VEF) 200 wherein all real electronic fuses REF(0), REF(1), . . . REF(N) exhibit the un-blown state, namely a logic zero in this particular embodiment. Detector 215 determines that zero (an even number) real fuses exhibit a blown state, as column 305 indicates for scenario 321. In response to this determination, detector 215 generates a logic low or logic zero VEF output signal at output 225, as column 310 indicates. This corresponds to an initial "virtual un-blown state", as shown in column 315 for scenario 321.

To change VEF 200 from the initial "virtual un-blown state" to a "virtual blown state" in scenario 322, programmer 205 instructs blow circuit BC(0) to blow real electronic fuse REF(0). REF(0) then exhibits a logic high or one as shown in scenario 322 of FIG. 3. The remaining real electronic fuses REF(1) . . . REF(N) still exhibit a logic low or zero. Thus, detector 305 determines that VEF 200 exhibits one blown fuse in scenario 322, namely an "odd" number of blown fuses, as seen in column 305. In response, detector 215 generates a logic high or one for the virtual fuse output signal at 225, as column 310 indicates. This corresponds to VEF 200 exhibiting a "virtual blown state", as seen in column 315 for scenario 322.

As discussed above, the disclosed technology enables VEF 200 to return to a "virtual un-blown state". To achieve this, fuse programmer 205 instructs blow circuit BC(1) to blow real electronic fuse REF(1), as shown in scenario 323. Real fuse REF(1) thus exhibits a logic high or one and real fuse REF(0) also still exhibits a logic high or one because programmer 205 blew it previously. Thus, under these conditions, detector 305 determines that VEF 200 exhibits two blown real electronic fuses in scenario 323, namely an "even" number of blown REFs, as seen in column 305. In response, detector 215 generates a logic low or zero for the virtual fuse output signal at 225, as column 310 indicates. This corresponds to VEF 200 once again exhibiting a "virtual un-blown state", as seen in column 315 for scenario 323. VEF 200 thus effectively returns to an un-blown state, namely a "virtual un-blown state" in scenario 323.

Although VEF 200 is now in a "virtual un-blown state", it is possible to yet again blow VEF 200. To achieve this, fuse programmer 205 instructs blow circuit BC(2) to blow real electronic fuse REF(2), as shown in scenario 324 in FIG. 3. Real electronic fuse REF(2) thus exhibits a logic high and real electronic fuses REF(0) and REF(1) still exhibit logic highs because programmer 205 blew them previously. Thus, under these conditions, detector 305 determines that VEF 200 exhibits three blown REFs in scenario 324, namely an "odd" number of blown REFs, as seen in column 305. In response, detector 215 generates a logic high or one for the virtual fuse output signal at 225, as column 310 indicates. This corresponds to VEF 200 again exhibiting a "virtual blown state", as seen in column 315 for scenario 324. VEF 200 thus returns to an un-blown state, namely a "virtual un-blown state" in scenario 324. Programmer 205 can continue effectively blowing and un-blowing VEF 200 until all real fuses in VEF 200 exhibit the blown state. Thus, the information that VEF 200 stores, or an array of such virtual fuses stores, is changeable for a number of times dependent on the number of real electronic fuses (REFs) that such VEFs contain.

Figure 4:
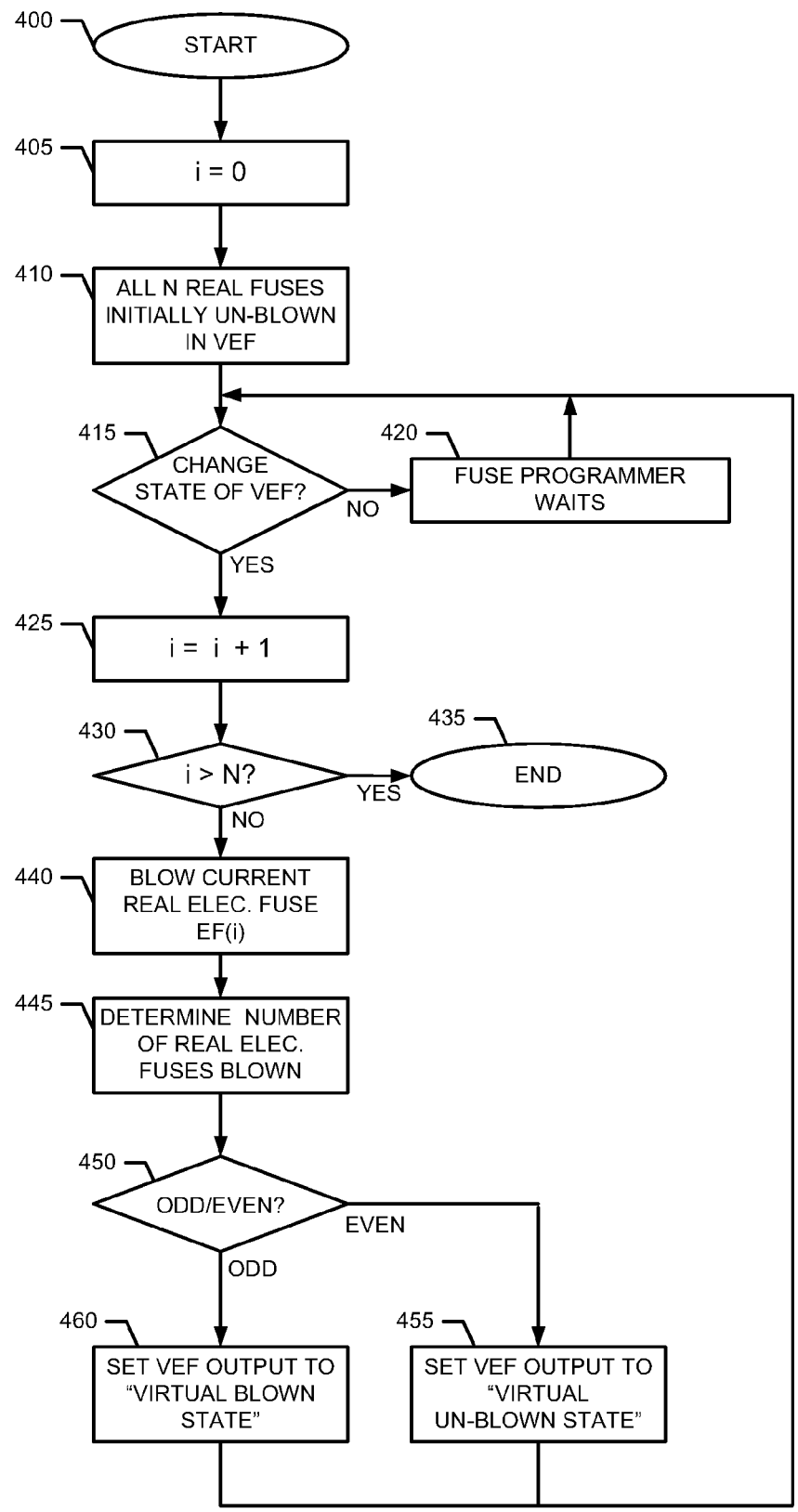
FIG. 4 is a flow chart that shows one embodiment of the methodology that the disclosed VEF employs.

FIG. 4 is a flowchart that depicts the methodology that a representative VEF 200 employs to change its state from "virtual un-blown" to "virtual blown" and vice versa. Process flow commences at start block 400. A counter or index i initializes at i=0, as per block 405. Index i corresponds to the number of currently blown real electronic fuses REF(0), REF(1), . . . REF(N) in VEF 200. Initially all real electronic fuses (REFs) in VEF 200 exhibit the un-blown state, as per block 410. Thus, index i initially equals 0. Decision block 415 tests to determine if a user, circuit or other entity instructs or commands programmer 205 to change the virtual state of VEF 200. If there is no such change state instruction, then fuse programmer 205 waits for such a change state instruction, as per block 420. When programmer 205 receives a change state instruction, index i increments by 1, as per block 425. If index i exceeds the total number of fuses N in VEF 200 at decision block 430, then no real electronic fuses remain for state change and the process halts at end block 435. However, if index i does not exceed the total number of fuses N at decision block 430, then a blow circuit blows the current real electronic fuse, namely fuse REF(i) or REF(1) for the first time VEF 200 blows one of its real electronic fuses (REFs), as per block 440. Detector 215 detects the number of real fuses currently exhibiting the blown state in VEF 200, as per block 445. The number of REFs currently blown in VEF 200 corresponds to the current index value, i. In one embodiment, decision block 450 conducts a test to determine if the number of REFs currently blown is odd or even. If the number of REFs currently blown in VEF 200 is "odd", then detector 225 sets the state of the VEF output signal to a "virtual blown state", as per block 460. However, if the number of fuses currently blown is "even", then detector 225 sets the state of the VEF output signal to a "virtual un-blown state", as per block 455. In either case, after block 460 or 455, process flow continues back to decision block 415 and fuse programmer 205 again waits at block 420 for another instruction to change the state of VEF 200. In the present example wherein the number of fuses currently blown equals one, the number of blown real fuses is "odd". Thus, detector 215 sets the virtual fuse output signal to exhibit a "virtual blown state".

When change of state decision block 415 receives another instruction to change the state of VEF 200, i.e. now to virtually "un-blow" VEF 200, the index i increments to a value of 2. VEF 200 then blows real fuse REF(2) that corresponds to the index value 2. Because the number of REFs blown in VEF 200 is now "even", block 455 now sets the VEF output signal to the "virtual un-blown state".

It is possible to yet again alter the state of VEF 200 back to the "virtual blown state". And after that it is again possible to alter the state of the VEF 200 back to the "virtual un-blown" state as long as the number of state changes or transitions does not exceed N, the number of real electronic fuses (REFs) in VEF 200. In this description, the terms "transition" and "state change" refer to changing from the "virtual un-blown state" to the "virtual blown state" and vice versa.

Figure 5A:
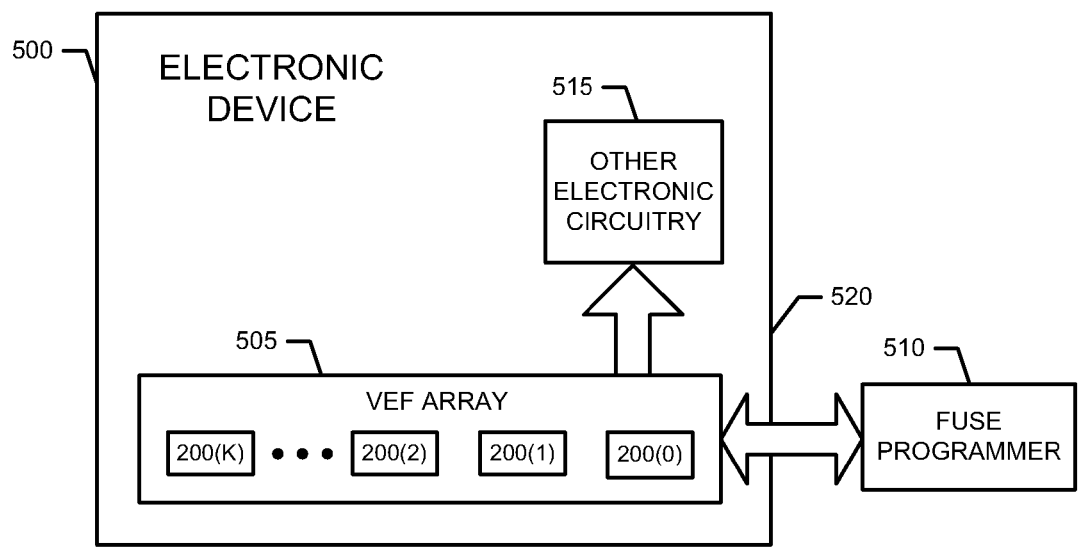
FIG. 5A is a block diagram of an electronic device that employs an array of virtual electronic fuses.

FIG. 5A is a block diagram of an electronic device 500 that includes a virtual electronic fuse (VEF) array 505 that stores information. VEF array 505 includes a number of virtual electronics fuses 200. For example, VEF array 505 includes VEFs 200(0), 200(1), . . . 200(K) wherein K is the total number of VEFs in VEF array 500. Each VEF of VEF array 505 stores a bit of digital information. A fuse programmer 510 couples to VEF array 505 to provide digital information to VEF array 505 for storage. The more VEFs that VEF array 505 includes, the greater is the amount of digital information that VEF array 505 may store. If K=7, then VEF array 505 may store an 8 bit word. If K=15, then VEF array 505 may store a 16 bit word. In one embodiment, each of the virtual electronic fuses in VEF array 500 is the same VEF 200 shown in FIG. 2. Each of VEFs 200 in VEF array 505 may include any number of REFs greater than 1 depending on the number of updates or virtual state changes desired for these VEFs. In one embodiment, each of the VEFs in VEF array 505 includes the same number of real electronic fuses (REFs), so that each VEF is updatable the same number of times as another VEF in the array. In another embodiment, an electronic device includes a primary configuration of virtual electronic fuses and a manufacturer, vendor or other entity changes the configuration during manufacture of a product that includes the electronic device.

Electronic device 500 not only includes VEF array 505, but also includes other electronic circuitry 515. For example, electronic device 500 may include other electronic circuitry such as general purpose processor circuitry, special purpose processor circuitry, heterogeneous processor circuitry, digital signal processor (DSP) circuitry, logic circuitry, memory circuitry, digital circuitry, analog circuitry, mixed signal circuitry, and any other circuitry that may benefit from information storage by VEF array 505. VEF array 505 couples to the electronic circuitry 515 to provide electronic circuitry 515 with the information that VEF array 505 stores. When other electronic circuitry 515 is processor circuitry, then electronic device 500 constitutes a processor. In one embodiment, electronic device 500 is a semiconductor device that includes a semiconductor die 520. Semiconductor die 520 includes VEF array 505 and electronic circuitry 515 that together form an integrated circuit.

Figure 5B:
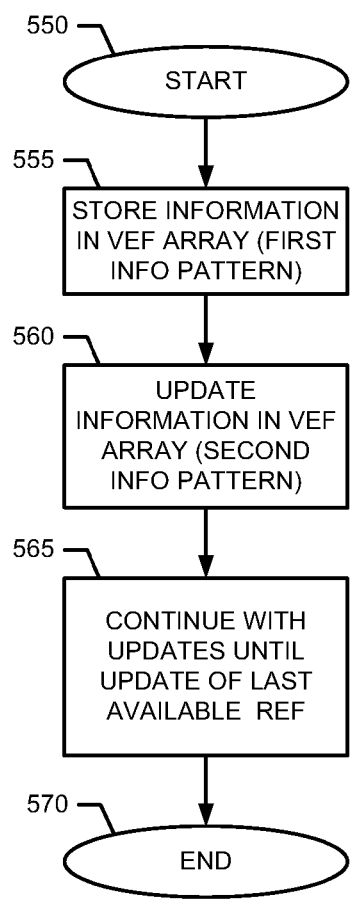
FIG. 5B is a flow chart that shows a method of storing information in the electronic device of FIG. 5A.

FIG. 5B is a flow chart that depicts a method of operating electronic device 500. Process flow commences at start block 550. Fuse programmer 510 then stores digital information in VEF array 505 by blowing selected real electronic fuses (REFs) in each of the VEFs thereof, as per block 555. For example, in an example wherein K=7, VEF array 505 may store an 8 bit word. To store the 8 bit word 00001111 or digital information pattern in VEF array 505, fuse programmer 510 sends a command to VEF array 505 that blows an REF in each of VEFs 200(0), 200(1), 200(2) and 200(3) while blowing no REFs in VEFs 200(4), 200(5), 200(6) and 200(7). In this scenario, VEFs 200(0), 200(1), 200(2) and 200(3) now exhibit the "virtual blown state" while the remaining VEFs exhibit the "virtual un-blown state".

Using the disclosed technology, it is possible to update or change the information in VEF array 505. For example, in the present example wherein 00001111 is the 8 bit word that VEF array 505 currently stores, it is possible to update or change this digital information to the 8 bit word 00001100. To perform this update, fuse programmer 510 instructs VEF array 505 to blow a second REF in each of VEFs 200(0) and 200(1), as per block 560. Fuse programmer 510 makes no changes to the remaining bits of VEF array 505, namely VEFs 200(2), 200(3), 200(4), 200(5), 200(6) and 200(7). In this manner, VEF array 505 now stores the 8 bit word 00001100. VEFs 200(0) and 200(1) now exhibit the "virtual un-blown state" while VEFs 200(2) and 200(3) exhibit the "virtual blown state". Remaining VEFs 200(4), 200(5), 200(6) and 200(7) also exhibit the "virtual un-blown state" because fuse programmer 510 did not yet program or blow these VEFs. Fuse programmer 510 may perform additional updates, as per block 565, until programmer 510 blows the last available REF in one of VEFs 200(0). VEF 200(7). Process flow ends at end block 570.

Figure 6:
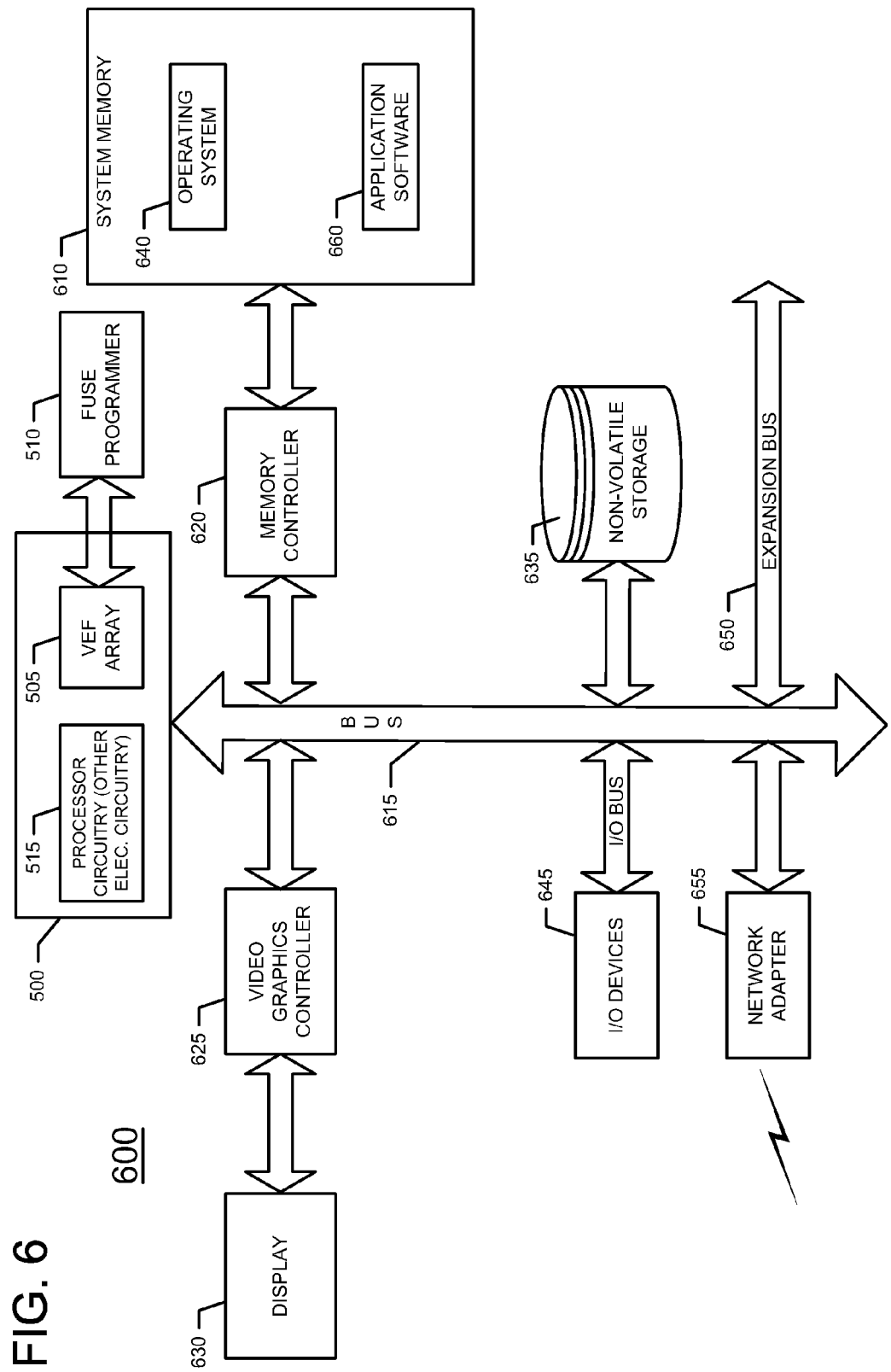
FIG. 6 is a block diagram of an information handling system (IHS) that employs the disclosed virtual electronic fuse array to store information.

FIG. 6 is a block diagram of an information handling system (IHS) 600 that includes an electronic device 500 that functions as the processor for IHS 600. In this embodiment, electronic device 500 includes processor electronic circuitry 515 and a VEF array 505 for storing configuration information, customization information or other digital information. Electronic device 500 is thus a processor electronic device in this particular example. A fuse programmer 510 couples to processor electronic device 500 to program or update VEF array 505 at desired times with desired information. Processor electronic device 500 couples to memory system 610 via a bus 615 and a memory controller 620. Bus 615 also couples processor electronic device 500 to a video graphics controller 625. A display 630 couples to video graphics controller 625. Nonvolatile storage 635, such as a hard disk drive, CD drive, DVD drive, or other nonvolatile storage couples to bus 615 to provide IHS 600 with permanent storage of information. An operating system 640 loads in memory 610 to govern the operation of IHS 600. I/O devices 645, such as a keyboard and a mouse pointing device, couple to bus 615. One or more expansion busses 650, such as USB, IEEE 1394 bus, ATA, SATA, PCI, PCIE and other busses, couple to bus 615 to facilitate the connection of peripherals and devices to IHS 600. A network adapter 655 couples to bus 615 to enable IHS 600 to connect by wire or wirelessly to a network and other information handling systems. System memory 610 stores application software 660 for execution. While FIG. 6 shows one IHS that employs a processor electronic device 500 with VEF array 505, the IHS may take many forms. For example, HS 600 may take the form of a desktop, server, portable, laptop, notebook, or other form factor computer or data processing system. IHS 600 may take other form factors such as a personal digital assistant (PDA), a gaming device, a portable telephone device, a communication device or other devices that include a processor and memory.

Depending on the depth of a particular VEF 200, namely the number of REFs in the VEF, the VEF may consume a relatively high number of real fuses. For example, to allow 2 state changes of the VEF, the VEF includes 2 REFs. To permit 10 state changes of the VEF, the VEF includes 11 REFs. An array of 10 VEFs of which each VEF is capable of 10 virtual state transitions may require 100 REFs. A more efficient way of providing virtual electronic fuse capability is desirable.

Figure 7A:
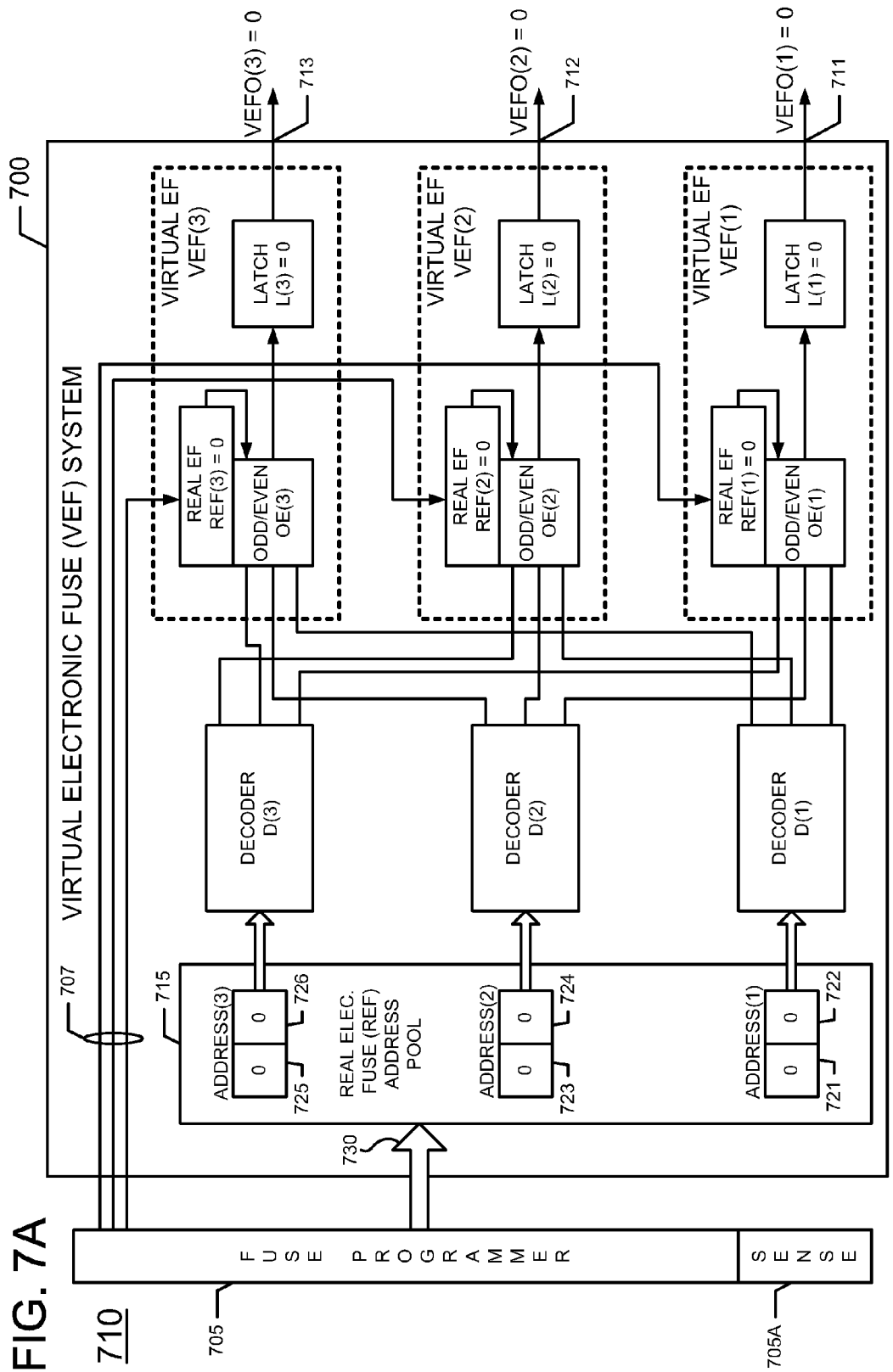
FIG. 7A-7E are block diagrams of another embodiment of the disclosed virtual electronic fuse system that employs a shared address pool.

FIG. 7A shows an alternative embodiment of a virtual electronic fuse (VEF) system 700 that includes multiple virtual electronic fuses (VEFs) that couple to a fuse programmer 705. In this particular example, virtual electronic fuse system 700 includes 3 virtual electronic fuses, VEF(1), VEF(2) and VEF(3) although other systems may employ more virtual electronic fuses by using the teachings herein. Virtual EF and VEF are abbreviations for a virtual electronic fuse. Real EF and REF are abbreviations for a real electronic fuse. VEF(1) includes a real electronic fuse, REF(1), that couples to fuse programmer 705 via real fuse programming bus 707 so that fuse programmer 705 may program or blow REF(1). In this embodiment, REF (1) includes an integral blow circuit (not shown) to enable the blowing of REF(1). REF(1) also includes an integral sense circuit (not shown) to enable the sensing of the state of REF(1). REF(2) and REF(3) likewise include respective blow circuits and sense circuits (not shown).

Fuse programmer 705 includes a sense circuit 705A that senses the state of VEF(1), VEF(2) and VEF(3) after each blow or un-blow operation to confirm the success of such operation. Virtual electronic fuse system 700 and fuse programmer 705 together form a virtual electronic fuse apparatus 710. An odd/even detector circuit, OE(1), couples to REF (1). In a manner similar to that discussed above with respect to odd/even detector 125 of FIG. 1, odd/even detector OE(1) toggles its output from a logic low to a logic high when it detects an odd number of high input signals. When odd/even detector OE(1) detects an even number of high input signals, the output of OE(1) exhibits a logic low. The output of odd/even detector OE(1) couples to the input of a latch L(1) that latches the logic state of the odd/even detector OE(1). Latch L(1) provides the output signal VEFO(1) of virtual electronic fuse VEF(1) at output 711.

Virtual electronic fuses VEF(2) and VEF(3) employ the same circuit topology as VEF(1) as shown in FIG. 7A. VEF (2) includes real electronic fuse REF(2), odd/even detector OE(2) and latch L(2). Latch L(2) provides the output signal VEFO(2) of virtual electronic fuse VEF(2) at output 712. VEF(3) includes real electronic fuse REF(3), odd/even detector OE(3) and latch L(3). Latch L(3) provides the output signal VEFO(3) of virtual electronic fuse VEF(3) at output 713.

VEF system 700 also includes an address pool 715 of real electronic fuses (REFs). In this particular example that employs 3 virtual fuses VEF(1), VEF(2) and VEF(3), address pool 715 includes 3 address storage locations, namely ADDRESS(1), ADDRESS(2) and ADDRESS(3). Address storage locations ADDRESS(1), ADDRESS(2) and ADDRESS(3) couple to respective address decoders D(1), D(2) and D(3) as shown. To designate a particular one of VEF(1), VEF(2) and VEF(3) for virtual stage change, fuse programmer 705 writes the address of the particular VEF to an available one of address locations ADDRESS(1), ADDRESS(2) and ADDRESS(3), as explained in more detail below. In one embodiment, address pool 715 is a shared pool of multi-bit storage locations, each bit corresponding to a real electronic fuse (REF). The multiple REFs of each address storage location together form a multi bit storage location to which fuse programmer 705 may write a VEF address.

Each of address decoders D(1), D(2) and D(3) includes a number of outputs equal to the number of virtual electronic fuses in VEF system 700. Thus, in this particular embodiment, each address decoder includes 3 outputs, namely one output for each of virtual electronic fuses VEF(1), VEF(2) and VEF(3). For example, address decoder D(1) includes three outputs that respectfully couple to virtual electronic fuses VEF(1), VEF(2) and VEF(3). More particularly, the 3 outputs of decoder D(1) couple to an input of the odd/even decoder OE(1) of VEF(1), an input of odd/even detector OE(2) of VEF(2) and an input of odd/even detector OE(3) of VEF(3).

In a similar manner, the 3 outputs of decoder D(2) couple to an input of the odd/even decoder OE(1) of VEF(1), an input of odd/even detector OE(2) of VEF(2) and an input of odd/even detector OE(3) of VEF(3). The 3 outputs of decoder D(3) couple to an input of the odd/even decoder OE(1) of VEF(1), an input of odd/even detector OE(2) of VEF(2) and an input of odd/even detector OE(3) of VEF(3). Each decoder may thus communicate with each of odd/even circuits OE(1)-OE(3) in the respective virtual electronic fuses VEF(1)-VEF(3).

In this particular embodiment, address storage locations ADDRESS(1), ADDRESS(2) and ADDRESS(3) each include 2 real electronic fuses, namely 2 bits, thus permitting 3 state changes, or blow/un-blow operations, among VEF(1), VEF(2) and VEF(3) as explained in more detail below. For example, address location ADDRESS(1) includes real electronic fuses 721, 722. Address location ADDRESS(2) includes real electronic fuses 723, 724. Address location ADDRESS(3) includes real electronic fuses 725, 726. The designer may provide address pool 715 with address locations each exhibiting a larger number of real electronics fuses or bits to provide virtual electronic fuses VEF(1)-VEF(3) with more state changes or blow/un-blow operations. Increasing the bit width or size of the address pool locations allows more VEFs in VEF system 700 since each VEF of VEF system 700 consumes a respective address. Increasing the bit width or size of the address pool locations may also permit more virtual state changes to the VEFs.

Fuse programmer 705 couples to real electronic fuse (REF) address pool 715 via a virtual fuse programming bus 730 so that fuse programmer 705 may select a particular one of VEF(1)-VEF(3) for virtual state change after the initial blowing of the REF of a particular VEF. Fuse programmer 705 sends an instruction, command, or other signal to REF address pool 715 to effect such selection of a particular VEF for state change as explained below.

As described above, fuse programmer 705 couples to real electronic fuses REF(1)-REF(3) within virtual electronic fuses VEF(1)-VEF(3) to enable fuse programmer 705 to physically change the state of those real electronic fuses REF(1)-REF(3) to blown one time. These are "real blow" operations because the states of REF(1)-REF(3) themselves may change from "real un-blown" to "real blown". Changing the state of any of REF(1)-REF(3) in the VEFs occurs in an initial real blow operation by programmer 705 before any following virtual state change requests or instructions by programmer 705. Other terms for these virtual state change requests include command signals, command instructions or programming instructions. FIG. 7A depicts real electronic fuses REF(1)-REF(3) of the VEFs and real electronic fuses 721-726 of the address pool 715 before fuse programmer 705 blows or changes the state of any of those fuses.

Figure 7B:
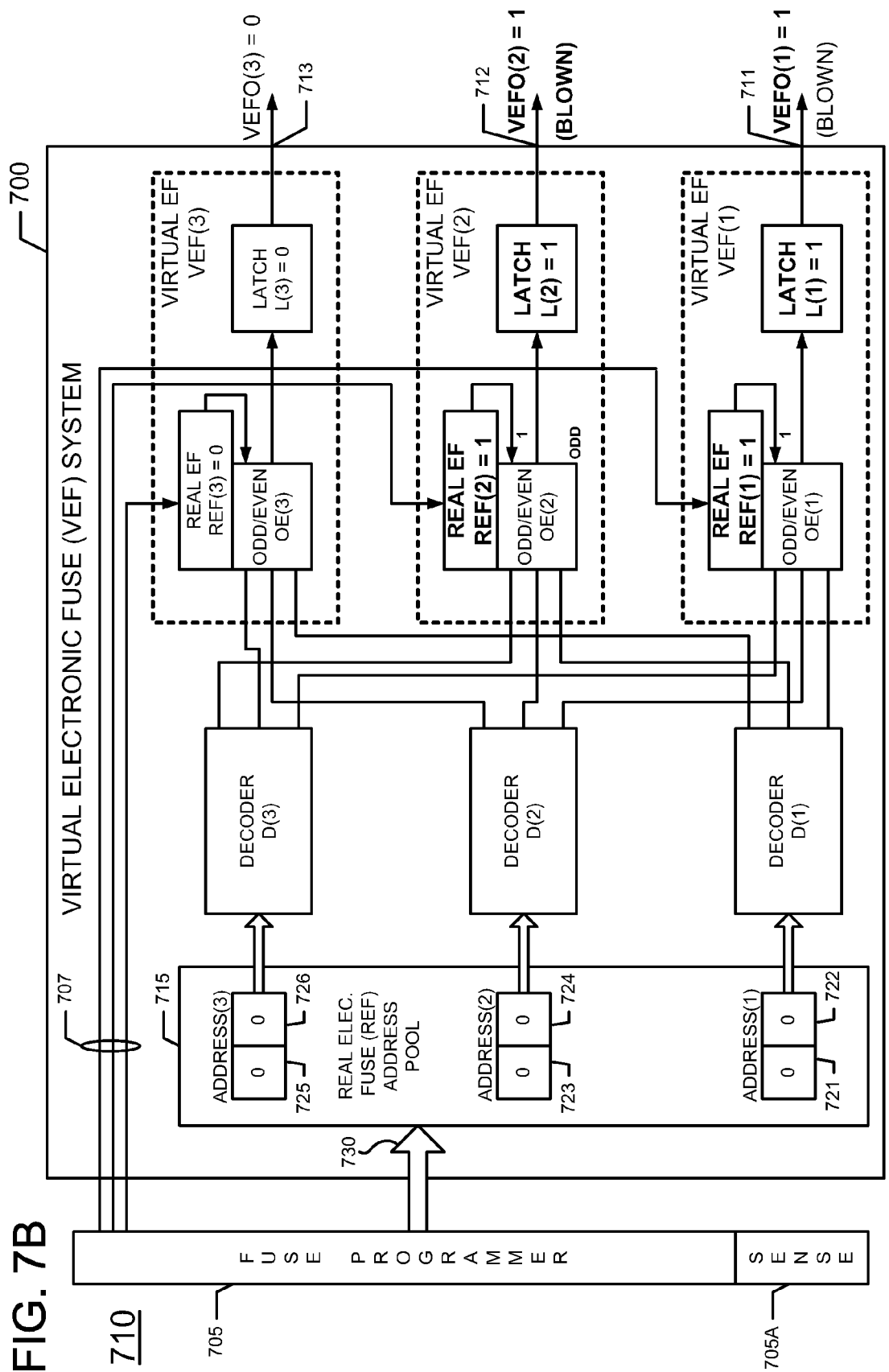

FIG. 7B shows virtual electronic fuse system 700 after fuse programmer 710 conducts a real blow operation on at least one of real electronic fuses REF(1)-REF(3) of virtual electronic fuses VEF(1)-VEF(3). In this particular example, fuse programmer 705 conducts a real blow operation on real electronic fuses REF(1) and REF(2). To accomplish these real blow operations, fuse programmer 705 sends programming instructions, commands or other signals over programming bus 707 to REF(1) and REF(2) to cause the blowing of REF(1) and REF(2). The outputs of REF(1) and REF(2) go high when fuse programmer 705 blows those REFs. Thus, in VEF(1), odd/even detector OE(1) detects that one of its inputs exhibits a logic high or logic 1, namely the input that couples to blown REF(1). Since this detection of a single input high is "odd", OE(1) outputs a logic high that latch L(1) latches. Thus, latch L(1) exhibits a logic high or 1 and the output VEFO(1) of virtual fuse VEF(1) exhibits a logic high as well. Turning now to VEF(2), odd/even detector OE(2) detects that one of its inputs exhibits a logic high or logic 1, namely the input that couples to blown REF(2). Since this detection of a single input high is "odd", OE(2) outputs a logic high that latch L(2) latches. Thus, latch L(2) exhibits a logic high or 1 and the output VEFO(2) of virtual fuse VEF(2) exhibits a logic high as well. VEF(1) and VEF(2) now exhibit a "virtual blown state". Virtual electronic fuse VEF(3) is still un-blown and thus output VEFO(3) exhibits the un-blown state, namely a logic low or 0.

Figure 7C:
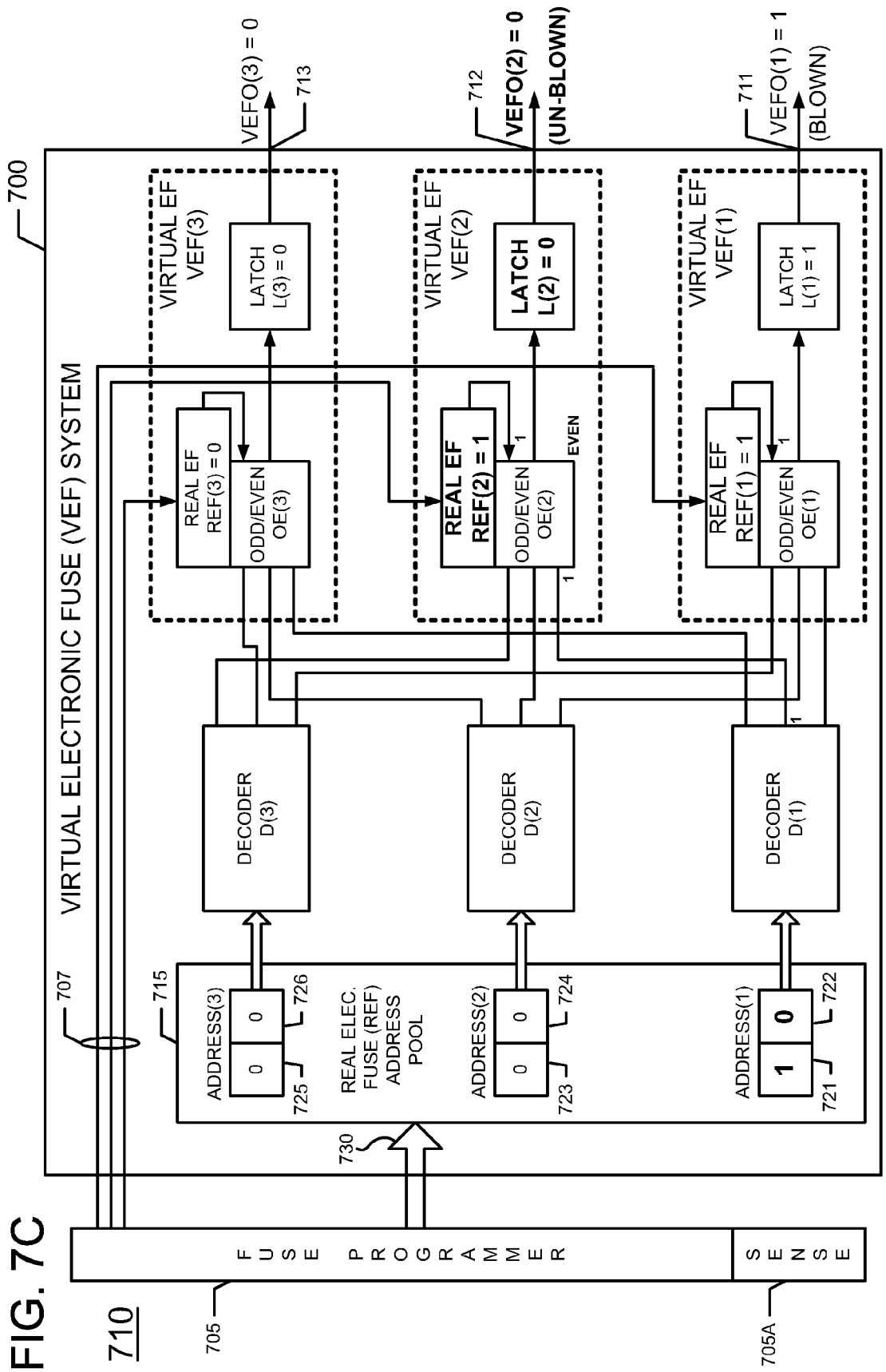

FIG. 7C shows the performance of a "virtual un-blow" state change on VEF(2). In this particular embodiment, VEF(1) exhibits an address of 01, VEF(2) exhibits an address of "10", and VEF(3) exhibits an address of "11". Each of address locations ADDRESS(1)-ADDRESS(3) are mappable to point to one of VEF(1)-VEF(3). The address locations may thus act as pointers to particular VEFs depending on the particular addresses stored in the address locations. For example, to instruct virtual electronic fuse VEF(2) to undergo an un-blow operation, fuse programmer 705 may place a pointer "10" in a free or open address location in address pool 715, such as open address location ADDRESS(1). More particularly, fuse programmer 705 places a "1" in real electronic fuse 721 by blowing REF 721. Fuse programmer 705 places a "0" in REF 722 by leaving REF 722 un-blown. In this manner, fuse programmer 705 populates address location ADDRESS(1) with a "10", namely the address of VEF(2). The "10" in address location ADDRESS(1) acts as an address pointer to VEF(2). Fuse programmer 705 accomplishes this population of the address locations in address pool 715 by sending programming instructions, commands or other signals over bus 730 to effect such population.

As shown in FIG. 7C, decoder D(1) couples to address location ADDRESS(1). Decoder D(1) decodes the "10" from ADDRESS(1) and interprets the "10" as indicating or selecting VEF(2). In response, decoder D(1) raises an input of odd/even detector OE(2) to a logic high or 1. Thus, two inputs of odd/even detector OE(2) now exhibit a logic 1. Odd/even detector OE(2) interprets these 2 high inputs as "even" and in response outputs a logic low to latch L(2). Latch L(2) latches this logic low as L(2)=0 so that the VEF(2) output signal VEFO(2) now exhibits a logic low, namely VEF0(2)=0. When VEF0(2) exhibits such a logic low, this indicates that virtual electronic fuse VEF(2) now again exhibits the "virtual un-blown state".

Figure 7D:
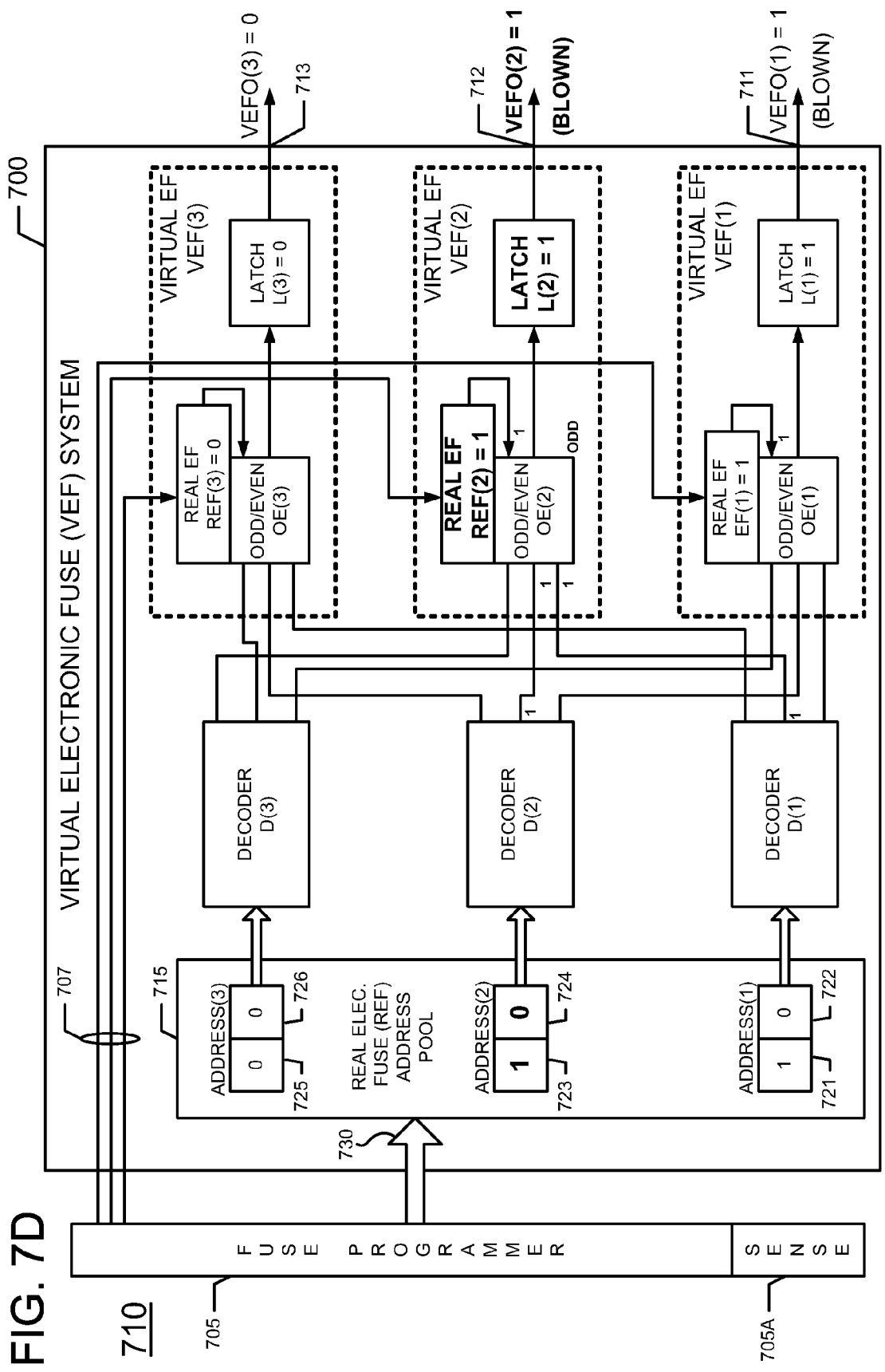

FIG. 7D shows how it is possible to change the state of virtual electronic fuse VEF(2) from the "virtual un-blown state" back to the "virtual blown state". To perform this state change, fuse programmer 705 programs a remaining address location in address pool 715 to exhibit the value "10" that corresponds to the address of virtual electronic fuse VEF(2). For example, fuse programmer 705 may program address location ADDRESS(2) to exhibit the "10" address that corresponds to VEF(2). In response, decoder D(2) raises an input of odd/even detector OE(2) to a logic high or 1. Thus, 3 inputs of odd/even detector OE(2) now exhibit a logic high. Odd/even detector OE(2) interprets the 3 high inputs as "odd" and in response outputs a logic high to latch L(2). Latch L(2) latches this logic high as L(2)=1 so that the VEF(2) output signal VEFO(2) now exhibits a logic high, namely VEF0(2)=1. When VEF0(2) exhibits such a logic high or 1, this indicates that virtual electronic fuse VEF(2) now exhibits the "virtual blown state" once again.

Figure 7E:
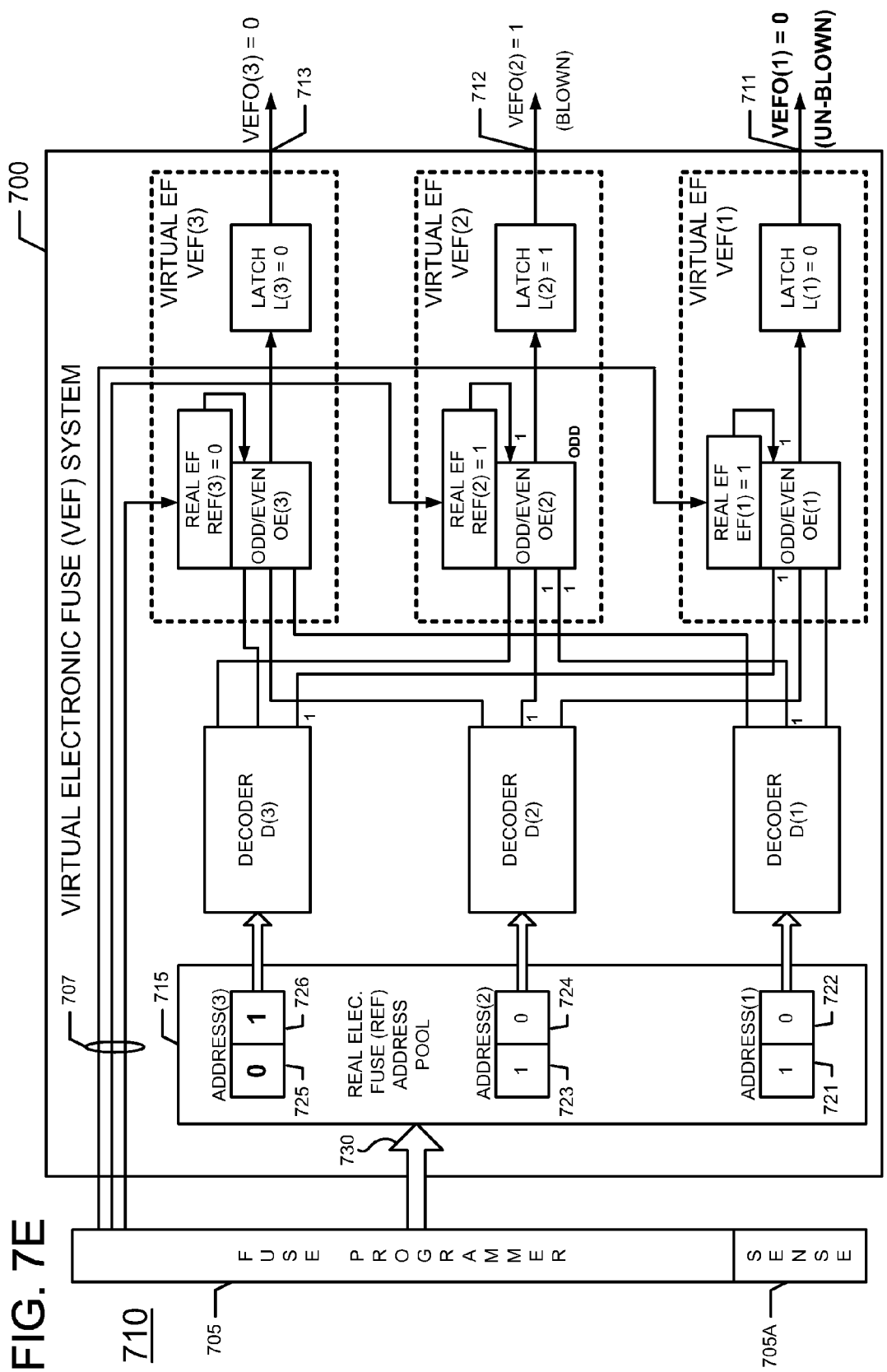

At this point in time, two of the three virtual un-blow/blow operations that virtual electronic fuse system 700 may perform are complete. In other words, the programming of address locations ADDRESS(1) and ADDRESS(2) is complete, while address location ADDRESS(3) is still free or open. Addresses location ADDRESS(3) is still available to allow one more virtual state change for one of virtual electronic fuses VEF(1)-VEF(3). For example, placing a "01" in address location ADDRESS(3) will cause virtual electronic fuse VEF(1) to change from the "virtual blown state" to the "virtual un-blown state" as shown in FIG. 7E. Decoder D(3) decodes the "01" from ADDRESS(3) and interprets the "01" as indicating VEF(1). Decoder D(3) raises an input of odd/even detector OE(1) to a logic high or 1. Thus, two inputs of odd/even detector OE(1) now exhibit a logic 1. Odd/even detector OE(1) interprets these 2 high inputs as "even" and in response outputs a logic low to latch L(1). Latch L(1) latches this logic low as L(1)=0 so that the VEF(1) output signal VEFO(1) now exhibits a logic low, namely VEF0(1)=0. When VEF0(1) exhibits such a logic low, this indicates that virtual electronic fuse VEF(1) now exhibits the "virtual un-blown state" once again.

In this particular example, even after the completion of the above 3 virtual un-blow/blow operations, real electronic fuse REF(3) still exhibits the real un-blown state. Thus, fuse programmer 705 may still at any time program or blow real electronic fuse REF(3) via real fuse programming bus 707. After such programming, real electronic fuse REF(3) of virtual electronic fuse VEF(3) will exhibit the real blown state and the output of VEFO(3) changes to a logic high to indicate a blown fuse for VEF(3). At this point, all three of the 2 bit address locations in address pool 715 store address information. Thus, there is no more room in address pool 715 to accommodate further changes in the virtual states of VEF(1)-VEF(3). To allow further virtual state changes, the address pool 715 may employ more address pool locations and respective decoders than shown in this particular example. VEF(1)-VEF(3) share the address locations of address pool 715 with respect to the number of virtual state changes possible for the VEFs. Sharing 3 address locations among the VEFs allows 3 virtual state changes total among the VEFs. Sharing 7 address locations allows 7 state changes total among the VEFs. Sharing 15 address locations allows 15 state changes among the VEFs. Increasing the bit width of each address location of address pool 715 is one way to increase the number of address locations in address pool 715. This approach allows an increase in the number of VEFs in the VEF system and an increase in the number of virtual state changes possible among the VEFs via shared address pool 715.

Figure 8:
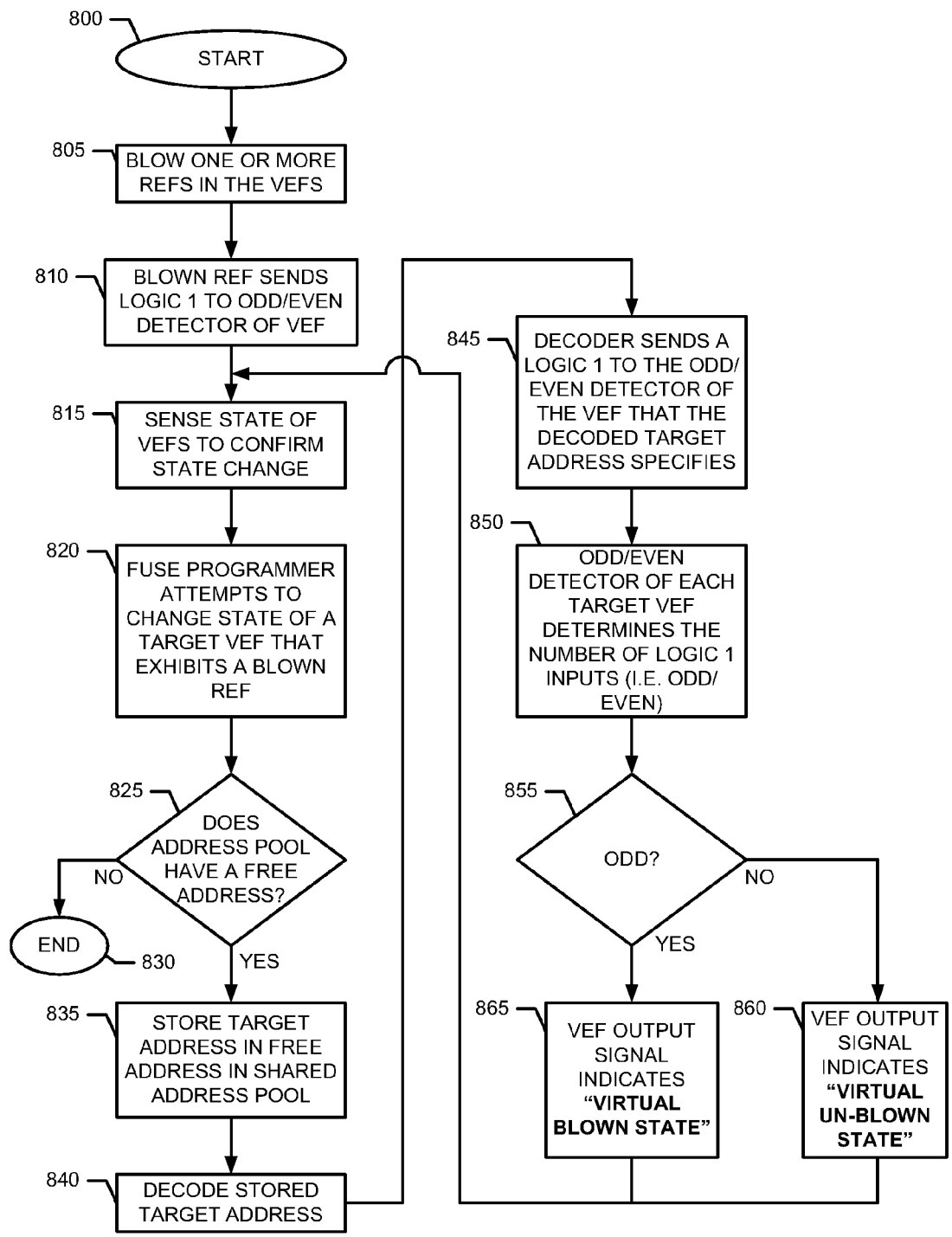
FIG. 8 is a flow chart that shows one embodiment of the methodology that the virtual electronic fuse system of FIGS. 7A-7E employs.

FIG. 8 is a flowchart that depicts process flow for the embodiment of the virtual electronic fuse system 700 that FIGS. 7A-7E illustrate. Process flow commences at start block 800. Fuse programmer 705 then blows one or more of the real electronic fuses, REF(1)-REF(3), in virtual electronic fuses, VEF(1)-VEF(3), as per block 805. This is a real blow operation because the state of a real electronic changes to the blown state. Each blown REF then sends a logic 1 to its respective odd/even detector circuit, as per block 810. For example, if fuse programmer 805 blows REF(2), then REF(2) sends a logic 1 to odd/even detector OE(2). FIG. 7B shows virtual electronic fuse VEF(2) wherein its real electronic fuse REF(2) exhibits the blown state and VEF(2) exhibits the "virtual blown state". Fuse programmer 705 may also blow more REFs within the VEFs. Sense circuit 705A then senses the state of the virtual electronic fuses VEF(1)-VEF(2) to confirm the success of these real blow operations, as per block 815. Sense circuit 705A may also sense the state of the real electronic fuses in REF address pool 715 as discussed below.

With one or more real electronic fuses (REFs) thus blown, fuse programmer 705 now attempts to change the state of a particular target virtual electronic fuse (VEF) that already exhibits a blown REF, as per block 820. For example, fuse programmer 705 attempts to change the state of VEF(2) from the "virtual blown state" that FIG. 7B shows to the "virtual un-blown state" that FIG. 7C shows. In the blown state, the VEF(2) output signal VEFO(2) exhibits a logic 1 or high. In other words, fuse programmer 705 will attempt an un-blow operation on VEF(2). This is a "virtual un-blow" operation. Fuse programmer 705 sends a command to real electronic fuse address pool 715 to determine if any address locations are free and available. More particularly, sense circuit 705A of fuse programmer 705 senses the state of the REFs forming ADDRESS(1), ADDRESS(2) and ADDRESS(3) to determine the availability of these addresses for virtual un-blow or virtual blow operations. If no address pool location is available, then the process terminates at end block 830. However, FIG. 7B shows that all three address pool locations ADDRESS(1), ADDRESS(2) and ADDRESS(3) are available in this particular example. Thus, process flow continues to block 835 wherein address pool 715 stores the target address of the target VEF in a free address location in shared address pool 715. For example, to begin a "virtual un-blow" operation on VEF(2) that exhibits the blown state (VEFO(2)=1) as shown in FIG. 7B, fuse programmer 705 writes the address of VEF(2), namely "10", in address location ADDRESS(1) as shown in FIG. 7C.

Decoders D(1)-D(3) decode any target address in their respective address locations ADDRESS(1)-ADDRESS(3), as per block 840. For example, decoder D(1) decodes the "10" target address in ADDRESS(1) as belonging to VEF(2). Thus, decoder D(1) sends a logic 1 to odd/even detector OE(2) of target VEF(2), as per block 845. Each odd/even detector of VEF(1)-VEF(3) determines the number of logic 1 inputs that it receives, as per block 850. Each odd/even detector performs an odd/even determination of that number, as per block 850. For example, if odd/even detector OE(2) of VEF(2) determines that it receives 2 logic 1 inputs, as shown in FIG. 7C, then OE(2) indicates the number is "even", namely not odd, as per decision block 855. In response, the output signal VEFO(2) of VEF(2) changes to 0 to indicate the virtual "un-blown" state for such an even number of OE(2) logic 1 inputs, as per block 860. Process flow now continues back to blocks 815 and 820 at which the fuse programmer 705 attempts another virtual state change of a particular target VEF.

Fuse programmer 705 may continue making virtual state changes in the VEFs as long as a free address location in shared address pool 715 is open to accommodate such a virtual state change. For example, if fuse programmer 705 attempts another change of the virtual state of VEF(2) from the "virtual un-blown state" back again to the "virtual blown state", then fuse programmer may write a "10" in free address location ADDRESS(2) as shown in FIG. 7D. This designates VEF(2) as the target of the requested state change. Decoder D(2) thus sends a logic 1 to an input of odd/even detector OE(2). Odd/even detector OE(2) thus receives 3 logic 1 input signals, thus indicating an "odd" number of logic 1 inputs, as per decision block 855 of the FIG. 8 flowchart. In response, the VEF output signal VEFO(2) changes to a logic 1 or high to indicate the "virtual blown state", as per block 865.

Figure 9:
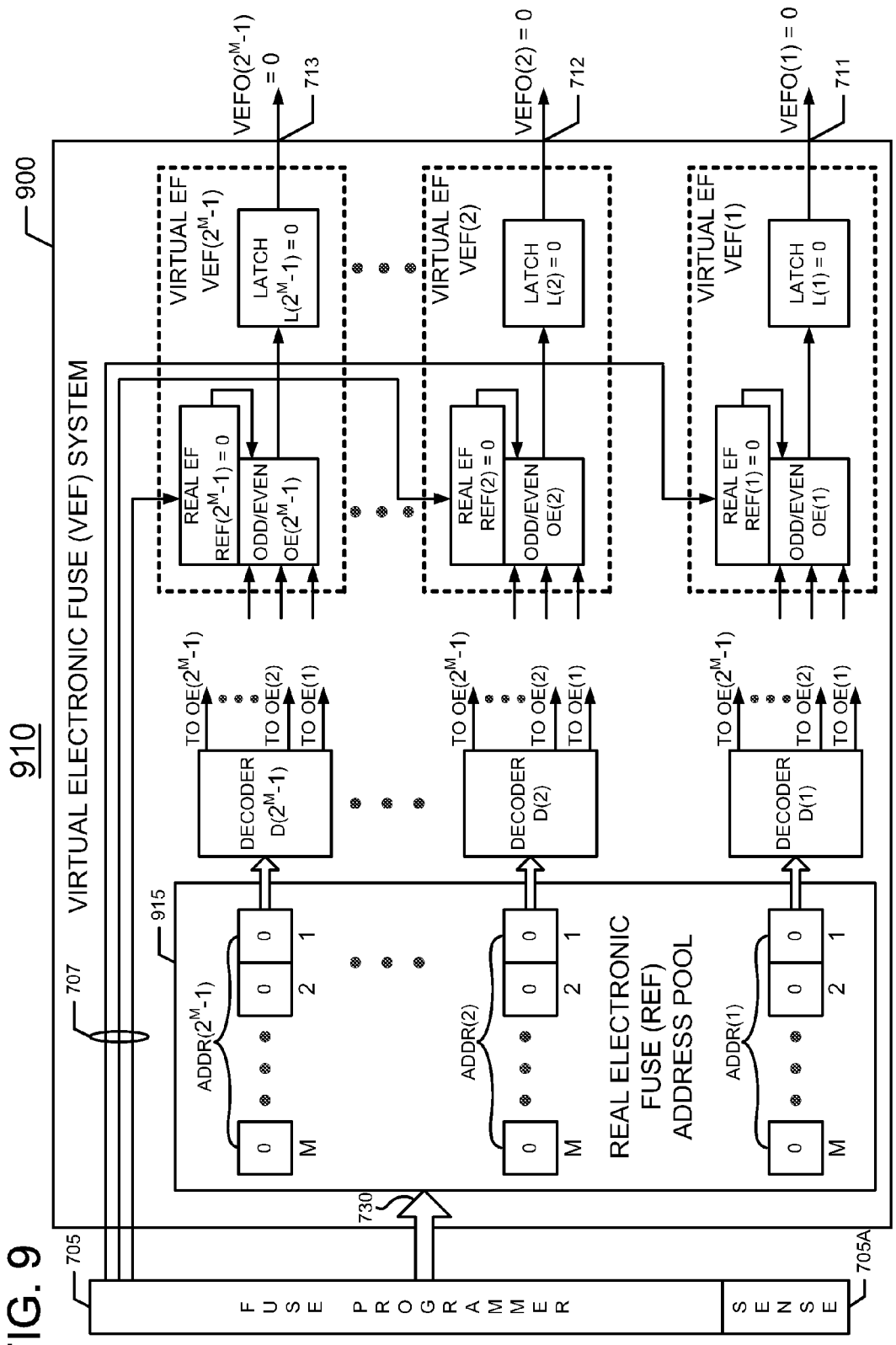
FIG. 9 is a generalized block diagram of the virtual electronic fuse system of FIGS. 7A-7E.

FIG. 9 shows a generalized embodiment of the disclosed virtual electronic fuse system as VEF system 900. VEF system 900 includes elements in common with VEF system 700 of FIGS. 7A-7E. Like numbers indicate like elements when comparing these VEF systems. VEF system 900 together with fuse programmer 705 form a virtual electronic fuse apparatus 910. Whereas system 700 of FIGS. 7A-7E includes two bit address locations in address pool 715, system 900 of FIG. 9 includes a shared REF address pool 915 with address locations each exhibiting up to M bits, as shown, wherein M is an integer. This permits more virtual electronic fuses (VEFs) and more virtual state changes than the two bit address pool of the embodiment of FIG. 7A-7E.

Shared REF address pool 915 includes address locations ADDR(1), ADDR(2), . . . ADDR($2^M$-1). Each of these address locations includes M bits, namely bits 1, 2, . . . M, as shown in FIG. 9. VEF system 900 includes ($2^M$-1) address decoders and virtual electronic fuses (VEFs). VEF system 900 thus forms an array of address locations, decoders, and VEFs. In this embodiment, there is one VEF for each address location in address pool 915. The last or highest address location in address pool 915 is ADDR($2^M$-1). Address location ($2^M$-1) couples to the last or highest decoder in the array, namely decoder D($2^M$-1). The last or highest VEF in the array is VEF($2^M$-1). Virtual electronic fuse VEF($2^M$-1) includes real electronic fuse REF($2^M$-1), odd/even detector OE($2^M$-1) and latch L($2^M$-1) as shown. VEFO($2^M$-1) is the output signal of VEF($2^M$-1). Each of decoders D(1), D(2), D($2^M$-1) couples to each of the odd/even detectors of VEF(1), VEF(2) . . . VEF($2^M$-1). For example, decoder D(1) includes outputs that couple to respective odd/even detectors OE(1), OE(2), . . . OE($2^M$-1). Similarly, decoder D(2) includes outputs that couple to respective odd/even detectors OE(1), OE(2), . . . OE($2^M$-1). This topology continues in a similar manner up to decoder D($2^M$-1) that includes outputs that couple to respective odd/even detectors OE(1), OE(2), . . . OE($2^M$-1).

The topology that FIG. 9 depicts accommodates $2^M$-1 virtual electronic fuses (VEFs) and permits $2^M$-1 total virtual state changes among those VEFs. Fuse programmer 705 may concentrate all $2^M$-1 virtual state changes on a single VEF or may spread the $2^M$-1 virtual state changes across the VEFs of the VEF array. By way of example, if M=2, then the VEF system may accommodate $2^2$-1 state changes, namely virtual 3 state changes. However, if M=3, then the VEF system may accommodate $2^3$-1 state changes, namely 7 stage changes. If M=4, then the VEF system may accommodate $2^4$-1 state changes, namely 15 stage state changes, in this embodiment.

VEF system 700 of FIG. 7A or VEF system 900 of FIG. 9 is usable in place of VEF array 505 in electronic device 500 of FIG. 5A and thus provides alternative embodiments. VEF system 700 of FIG. 7A or VEF system 900 of FIG. 9 is also usable in place of VEF array 505 in the information handling system (IHS) embodiment shown in FIG. 6, thus providing yet another embodiment.

The foregoing discloses a virtual electronic fuse methodology and a virtual electronic fuse apparatus that enables multiple virtual state change operations.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Those skilled in the art may invert the logic states of some of the representative embodiments, but still obtain the same functionality taught by these examples. Moreover, persons skilled in the art after having the benefit of this description of the invention may use certain features of the invention independently of the use of other features, without departing from the scope of the invention.

What is claimed is:

1. A method of changing state in an electronic fuse system, the method comprising the steps of:
    providing a plurality of virtual electronic fuses (VEFs) that may each exhibit a virtual blown state or a virtual un-blown state, each VEF having a respective address;
    transmitting, by a fuse programmer, the address of a particular VEF to designate the particular VEF for state change; and
    changing the state of the particular VEF from one of the virtual blown state and the virtual un-blown state to the other of the virtual blown state and the virtual un-blown state.

2. The method of claim 1, wherein the changing step includes changing, by the fuse programmer, the state of a real electronic fuse included in the particular VEF thus resulting in a first change of state of the particular VEF.

3. The method of claim 2, wherein the transmitting step further comprises sending, by the fuse programmer, the address of the particular VEF to instruct a second change of the state of the particular VEF after the first change of state.

4. The method of claim 3, wherein the sending step includes writing, by the fuse programmer, the address of the particular VEF to an address location in a real electronic fuse (REF) address pool thus providing a pointer to the particular VEF, the address pool including a plurality of address locations, each address location being mappable to point to any of the VEFs.

5. The method of claim 4, wherein a plurality of REFs form each address location in the address pool.

6. The method of claim 5, further comprising decoding, by a decoder, the address stored in an address location of the address pool to designate the particular VEF.

7. The method of claim 5, further comprising receiving, by a detector in a VEF, a plurality of input signals, the detector indicating one of the virtual blown state and the virtual un-blown state if the detector receives an odd number of input signals exhibiting a first logic state, and indicating the other of the virtual blown state and the virtual un-blown state if the detector receives an even number of input signals exhibiting the first logic state.

8. The method of claim 7, wherein a REF in the particular VEF generates a REF signal that is supplied to the detector as one of the input signals, one of the decoders providing another input signal to the detector.

9. An electronic fuse system, comprising:
    a plurality of virtual electronic fuses (VEFs) that may each exhibit a virtual blown state or a virtual un-blown state, each VEF having a respective address, each VEF including:
        a real electronic fuse (REF) that may exhibit a real un-blown state or a real blown state;
        a detector, coupled to the REF, that indicates one of the virtual blown state and the virtual un-blown state if the detector receives an odd number of input signals exhibiting a first logic state, and indicating the other of the virtual blown state and the virtual un-blown state if the detector receives an even number of logic signals exhibiting the first logic state.

10. The electronic fuse system of claim 9, wherein the electronic fuse system includes an input that is couplable to a fuse programmer that designates a particular VEF for state change from the virtual un-blown state to the virtual blown state.

11. The electronic fuse system of claim 10, wherein the real fuse in the particular VEF changes state from a real un-blown state to a real blown state in response to the fuse programmer, the real fuse in the particular VEF providing a first input signal exhibiting the first logic state to the detector in the particular VEF, such that the particular VEF exhibits the virtual blown state.

12. The electronic fuse system of claim 11, wherein the detector of the particular VEF is configured such that receiving by the detector of the first input signal exhibiting the first logic state corresponds to receiving an odd number of input signals so that the VEF exhibits the virtual blown state.

13. The electronic fuse system of claim 11, further comprising an REF address pool coupled to the plurality of VEFS, the REF address pool including a plurality of address locations, the REF address pool including an address pool input that is couplable to the fuse programmer.

14. The electronic fuse system of claim 13, wherein the REF address pool is configured such that the fuse programmer may write the address of the particular VEF to an address location in the real electronic fuse (REF) address pool, thus providing a pointer to the particular VEF.

15. The electronic fuse system of claim 14, further comprising a plurality of decoders, each decoder being coupled to a respective address location in the REF address pool, the decoder that is coupled to the address location for the particular VEF sending a second input signal exhibiting the first logic state to the detector of the particular VEF, such that the detector of the particular VEF receives an even number of input signals and in response the VEF exhibits the virtual un-blown state.

16. An integrated circuit, comprising:
a semiconductor die;
a virtual electronic fuse (VEF) system, situated on the semiconductor die, the VEF system including:
a plurality of virtual electronic fuses (VEFs) that may each exhibit a virtual blown state or a virtual un-blown state, each VEF having a respective address, each VEF including:
a real electronic fuse (REF) that may exhibit a real un-blown state or a real blown state;
a detector, coupled to the REF, that indicates one of the virtual blown state and the virtual un-blown state if the detector receives an odd number of input signals exhibiting a first logic state, and indicating the other of the virtual blown state and the virtual un-blown state if the detector receives an even number of logic signals exhibiting the first logic state.

17. The integrated circuit of claim 16, wherein the VEF system includes an input that is couplable to a fuse programmer that designates a particular VEF for state change from the virtual un-blown state to the virtual blown state.

18. The integrated circuit of claim 17, wherein the real fuse in the particular VEF changes state from a real un-blown state to a real blown state in response to the fuse programmer, the real fuse in the particular VEF providing a first input signal exhibiting the first logic state to the detector in the particular VEF, such that the particular VEF exhibits the virtual blown state.

19. The integrated circuit of claim 18, wherein the detector of the particular VEF is configured such that receiving by the detector of the first input signal exhibiting the first logic state corresponds to receiving an odd number of input signals so that the VEF exhibits the virtual blown state.

20. The integrated circuit of claim 18, further comprising an REF address pool coupled to the plurality of VEFS, the REF address pool including a plurality of address locations, the REF address pool including an address pool input that is couplable to the fuse programmer.

21. The integrated circuit of claim 20, wherein the REF address pool is configured such that the fuse programmer may write the address of the particular VEF to an address location in the real electronic fuse (REF) address pool, thus providing a pointer to the particular VEF.

22. The integrated circuit of claim 21, further comprising a plurality of decoders, each decoder being coupled to a respective address location in the REF address pool, the decoder that is coupled to the address location for the particular VEF sending a second input signal exhibiting the first logic state to the detector of the particular VEF, such that the detector of the particular VEF receives an even number of input signals and in response the VEF exhibits the virtual un-blown state.

23. An information handling system (IHS), comprising:
a memory;
a processor coupled to the memory, the processor being situated on a semiconductor die;
a virtual electronic fuse (VEF) system, situated on the semiconductor die, the VEF including:
a plurality of real electronic fuses (REFs), some of the REFs exhibiting a blown state thus providing a number of blown REFs; and
a detector, coupled to the plurality of REFs, that indicates one of a virtual blown state and a virtual un-blown state for the VEF when the number of blown REFs is even and that indicates the other of the virtual blown state and the virtual un-blown state when the number of blown REFs is odd.

24. The IHS of claim 23, wherein the VEF system includes an input that is couplable to a fuse programmer that designates a particular VEF for state change from the virtual un-blown state to the virtual blown state.

25. The IHS of claim 24, wherein the real fuse in the particular VEF changes state from a real un-blown state to a real blown state in response to the fuse programmer, the real fuse in the particular VEF providing a first input signal exhibiting the first logic state to the detector in the particular VEF, such that the particular VEF exhibits the virtual blown state.

26. The IHS of claim 25, wherein the detector of the particular VEF is configured such that receiving by the detector of the first input signal exhibiting the first logic state corresponds to receiving an odd number of input signals so that the VEF exhibits the virtual blown state.

27. The IHS of claim 25, further comprising an REF address pool coupled to the plurality of VEFS, the REF address pool including a plurality of address locations, the REF address pool including an address pool input that is couplable to the fuse programmer.

28. The IHS of claim 27, wherein the REF address pool is configured such that the fuse programmer may write the address of the particular VEF to an address location in the real electronic fuse (REF) address pool, thus providing a pointer to the particular VEF.

29. The IHS of claim 28, further comprising a plurality of decoders, each decoder being coupled to a respective address location in the REF address pool, the decoder that is coupled to the address location for the particular VEF sending a second input signal exhibiting the first logic state to the detector of the particular VEF, such that the detector of the particular VEF receives an even number of input signals and in response the VEF exhibits the virtual un-blown state.

* * * * *